(12) United States Patent
Yang

(10) Patent No.: US 12,165,724 B2
(45) Date of Patent: Dec. 10, 2024

(54) METHOD FOR DETERMINING A STATUS OF A FUSE ELEMENT

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 363 days.

(21) Appl. No.: 17/540,808

(22) Filed: Dec. 2, 2021

(65) Prior Publication Data

US 2023/0178161 A1 Jun. 8, 2023

(51) Int. Cl.
*G11C 29/02* (2006.01)

(52) U.S. Cl.
CPC .................................. *G11C 29/027* (2013.01)

(58) Field of Classification Search
CPC ..................................................... G11C 29/027
USPC .......................................................... 702/58
See application file for complete search history.

(56) References Cited

U.S. PATENT DOCUMENTS

| 6,087,889 | A | * | 7/2000 | Mok | .......................... | G05F 1/46 |
| | | | | | | 327/51 |
| 7,349,281 | B2 | | 3/2008 | Kouchi et al. | | |
| 8,345,501 | B2 | | 1/2013 | Jeong | | |
| 9,984,762 | B1 | * | 5/2018 | Seshasayee | .......... | G11C 29/027 |
| 10,854,306 | B1 | * | 12/2020 | Samuels | ................... | G11C 7/08 |
| 11,587,632 | B1 | | 2/2023 | Yang | | |
| 11,749,364 | B2 | | 9/2023 | Yang | | |
| 11,756,641 | B2 | | 9/2023 | Yang | | |
| 2002/0008544 | A1 | | 1/2002 | Lim et al. | | |
| 2005/0247996 | A1 | | 11/2005 | Chung et al. | | |
| 2009/0080277 | A1 | * | 3/2009 | Chen | ........................ | G11C 7/20 |
| | | | | | | 365/218 |
| 2011/0163758 | A1 | * | 7/2011 | Huang | ................... | G11C 17/18 |
| | | | | | | 324/550 |
| 2012/0039140 | A1 | * | 2/2012 | Kim | ....................... | G11C 17/16 |
| | | | | | | 365/225.7 |

(Continued)

FOREIGN PATENT DOCUMENTS

| TW | 379396 | B | 1/2000 |
| TW | 200933177 | A | 8/2009 |

OTHER PUBLICATIONS

J. Im, B. Ang, S. Tumakha and S. Paak, "Characterization of Silicided Polysilicon Fuse Implemented in 65nm Logic CMOS Technology," 2006 7th Annual Non-Volatile Memory Technology Symposium, San Mateo, CA, USA, 2006, pp. 55-57, doi: 10.1109/ NVMT.2006.378877. (Year: 2006).*

(Continued)

*Primary Examiner* — Yoshihisa Ishizuka
*Assistant Examiner* — Joshua L Forristall
(74) *Attorney, Agent, or Firm* — Xuan Zhang

(57) ABSTRACT

A method for determining a status of a fuse element are provided. The method includes providing the memory device including a first terminal and a second terminal; applying a first power signal on the first terminal of the semiconductor device, wherein the memory device includes a configurable reference resistor unit electrically coupled to the fuse element; obtaining an evaluation signal, in response to the first power signal, at the second terminal of the memory device; and identifying the evaluation signal to determine whether the memory device is redundant.

12 Claims, 15 Drawing Sheets

(56) References Cited

U.S. PATENT DOCUMENTS

| | | | |
|---|---|---|---|
| 2016/0035435 A1* | 2/2016 | Teno | G11C 14/00 365/96 |
| 2016/0077146 A1* | 3/2016 | Englekirk | H02H 3/046 324/550 |
| 2021/0166776 A1* | 6/2021 | Wieduwilt | G11C 29/789 |
| 2021/0375388 A1* | 12/2021 | Lee | G11C 29/027 |
| 2023/0178161 A1 | 6/2023 | Yang | |
| 2023/0180471 A1 | 6/2023 | Yang | |
| 2023/0215506 A1 | 7/2023 | Yang | |
| 2023/0215507 A1 | 7/2023 | Yang | |

OTHER PUBLICATIONS

Office Action mailed on Jun. 5, 2023 related to Taiwanese Application No. 111105558.
Office Action mailed on Nov. 6, 2023 related to U.S. Appl. No. 17/542,931.

* cited by examiner

METHOD FOR DETERMINING A STATUS OF A FUSE ELEMENT

TECHNICAL FIELD

The present disclosure relates to a method for determining a status of a fuse element, and more particularly, to a method for determining a status of a fuse element in a memory device.

DISCUSSION OF THE BACKGROUND

Fuses and e-fuses are commonly used in memory elements to convert a redundant memory cell to a normal memory cell. A test circuit is utilized to determine the status of the fuse (i.e., whether the fuse is blown), such that the corresponding memory cell can be identified as a normal memory cell or a redundant memory cell. With evolving technology, the size of memory elements decreases, and the resistance of the fuse may sometimes thus fail to meet the desired value due to process variants. As a result, the status of the fuse may not be correctly identified. In present practice, this issue can be addressed by modifying a reference resistor in the memory elements. Nevertheless, modifying a reference resistor in the memory elements implies restarting the entire manufacturing process with additional photomask needed, and thus inevitably time and cost consuming.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor circuit for determining a status of a fuse element of a memory device. The semiconductor circuit includes a configurable reference resistor unit having a first terminal configured to receive a first power signal and a second terminal configured to electrically couple with the fuse element. The semiconductor circuit also includes a first switching circuit configured to electrically connect the configurable reference resistor unit and the fuse element. In addition, the semiconductor circuit further includes a latch circuit configured to read an evaluation signal of a first node between the configurable reference resistor unit and the fuse element.

Another aspect of the present disclosure provides a semiconductor device for determining a status of a fuse element of a memory device. The semiconductor device comprises a configurable reference resistor unit having a first terminal configured to receive a first power signal and a second terminal configured to electrically couple with the fuse element. The semiconductor device also includes a latch circuit configured to read an evaluation signal of a first node between the configurable reference resistor unit and the fuse element.

Another aspect of the present disclosure provides a method for determining a status of a fuse element of a memory device. The method includes providing a memory device including a first terminal and a second terminal and applying a first power signal to the first terminal of the semiconductor device. The memory device includes a configurable reference resistor unit electrically coupled to the fuse element. The method also includes obtaining an evaluation signal at the second terminal of the memory device and identifying the evaluation signal to determine whether the memory device is redundant.

The configurable reference resistor unit exhibits variable resistance. The variable resistance can be adjusted in accordance with varying resistance of the fuse element, caused by the process variants. According to the actual resistance of the corresponding fuse element, the resistance of the configurable reference resistor can be changed after manufacture is complete. Therefore, the present disclosure provides a device with improved flexibility. With the device having the configurable reference resistor unit, no additional photomask to modify the reference resistor is required. Further, with no need to restart the entire manufacturing process, production time is reduced.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It can also be appreciated by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
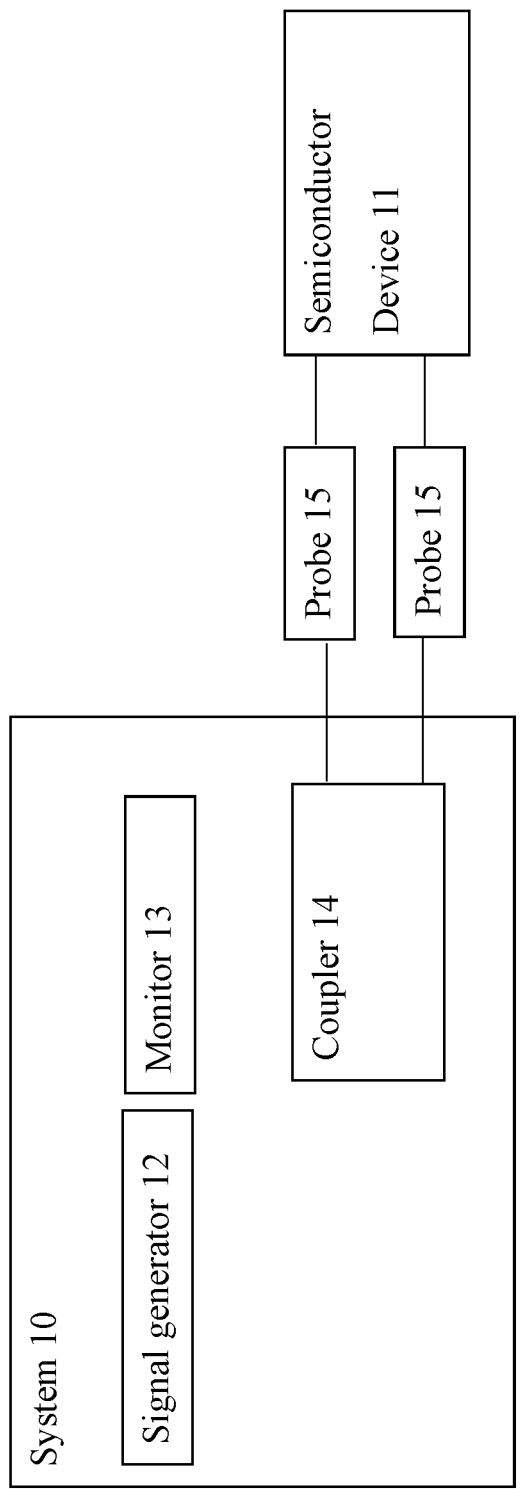
FIG. 1 is a schematic diagram of a system for testing semiconductor device, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that when an element is referred to as being "connected to" or "coupled to" another element, the initial element may be directly connected to, or coupled to, another element, or to other intervening elements.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

It should be noted that the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. In yet another aspect, the term "about" means within 10, 9, 8, 7, 6, 5, 4, 3, 2, or 1% of the reported numerical value.

FIG. 1 is a diagram of a system 10 for testing a semiconductor device, in accordance with some embodiments of the present disclosure.

According to FIG. 1, the system 10 is configured to monitor a semiconductor device 11. In some embodiments, the system 10 is configured to test the semiconductor device 11. The semiconductor device may be memory, memory device, memory die, or memory chip. In some embodiments, the semiconductor device 11 may include one or more memory cells. The semiconductor device 11 can be tested after fabrication, and shipped thereafter.

In some embodiments, the system 10 can constitute testing equipment. The system 10 may include hardware and software components that provide a suitable operational and functional environment for testing. In some embodiments, the system 10 may include a signal generator 12, a monitor 13, and a coupler 14.

The signal generator 12 is configured to generate a test signal. In some embodiments, the signal generator 12 can provide a power signal. It should be understood that other electrical signals such as data signals and power signals can further be provided to the semiconductor device 11.

The monitor 13 is configured to determine a status of the semiconductor device 11. The monitor 13 can be configured to determine a status of a component of the semiconductor device 11. The response signals can be identified by the monitor 13 to determine whether a component (e.g., a memory cell) of the semiconductor device 11 is a normal device or a redundant device.

The coupler 14 is configured to couple the signal generator 12 to the semiconductor device 11. In some embodiments, the coupler 14 can be coupled to the semiconductor device 11 by one or more probes 15. The probes 15 can be part of a probe head or probe package (not shown). The probes 15 can be electrically coupled to test conductive contacts (pads) and/or bonding pads disposed on the semiconductor device 11. The test conductive pads and/or bonding pads provide electrical connections to an interconnect structure (e.g., wiring) of the semiconductor device 11. For example, some of the probes can be coupled to pads that are associated with a power supply terminal (e.g., VDD) and ground terminal (e.g., VSS) of the semiconductor device 11. Other probes can be coupled to pads associated with input/output (I/O) terminals (e.g., data signals) of the semiconductor device 11. As such, the system 10 is operable to apply electrical signals to the semiconductor device 11 and obtain response signals from the semiconductor device 11 during testing.

Figure 2:
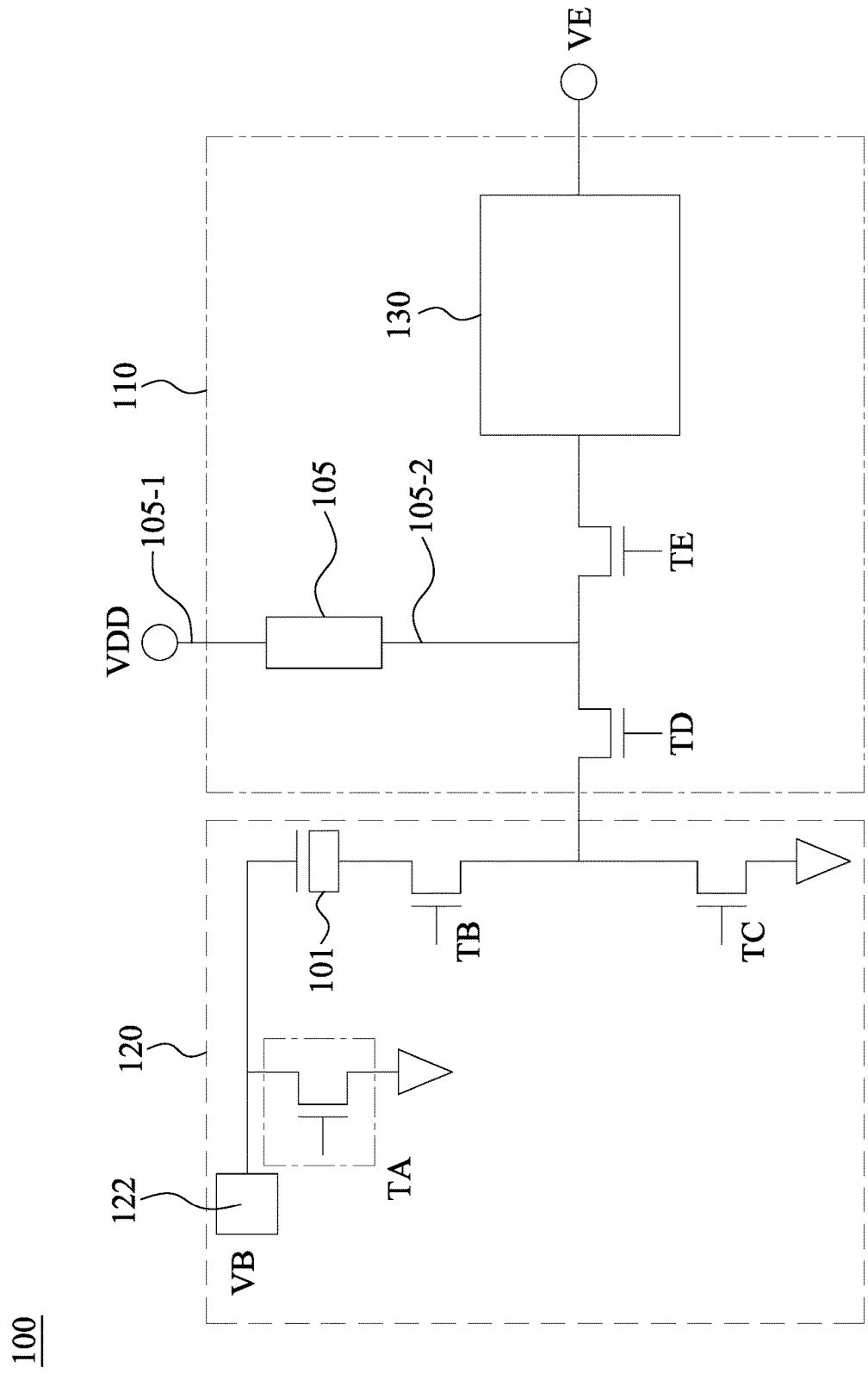
FIG. 2 is a schematic diagram of a semiconductor device, in accordance with some embodiments of the present disclosure.

FIG. 2 is a schematic diagram of a semiconductor device 100, in accordance with some embodiments of the present disclosure. The semiconductor device 100 can be memory, memory device, memory die, or memory chip. The semiconductor device 100 can be a portion of memory, memory device, memory die, or memory chip. For example, the memory can be a dynamic random access memory (DRAM). In some embodiments, the DRAM can be a double data rate four generation (DDR4) DRAM. In some embodiments, the memory includes one or more memory cells (or memory bits, memory blocks). In some embodiments, the memory cell includes a fuse element.

The semiconductor device 100 can include a fuse element 101, an evaluating unit 110, and a status-setting unit 120. In some embodiments, the evaluating unit 110 can include a configurable reference resistor unit 105, switching circuits TD and TE, and a latch circuit 130. In some embodiments, the fuse element 101 and the switching circuits TA and TB can act as a portion of the evaluating unit 110. In some embodiments, the status-setting unit 120 can include the fuse element 101, a conductive contact 122, and two switching circuits TB and TC.

Referring to FIG. 2, the configurable reference resistor unit 105 has a terminal 105-1 configured to receive a power signal VDD. The configurable reference resistor unit 105 has a terminal 105-2 configured to electrically couple with the fuse element 101. In some embodiments, the switching circuit TB can be connected to the fuse element 101. The switching circuit TD can be connected to the configurable reference resistor unit 105. In some embodiments, the switching circuit TD can be connected to the switching circuit TB. In some embodiments, the fuse element 101 can be coupled to ground through the switching circuits TB and TC. The switching circuit TA can be connected to the fuse element 101. The switching circuit TA can be connected to ground.

In some embodiments, the latch circuit 130 is coupled to the configurable reference resistor unit 105. The latch circuit 130 can be coupled to the fuse element 101 through the switching circuits TB, TD, and TE. In some embodiments, the switching circuit TE is connected to the configurable reference resistor unit 105. The switching circuit TE can be connected to the latch circuit 130. In some embodiments, the switching circuit TE can be connected to the switching circuit TD. An evaluation/output signal may be obtained at a conductive terminal VE of the latch circuit 130.

Referring to FIG. 2, the conductive contact 122 can be connected to the fuse element 101. The conductive contact 122 may be a test pad, a probe pad, a conductive pad, a conductive terminal, or other suitable element. In some embodiments, the conductive contact 122 is configured to receive a status-setting signal VB. In some embodiments, the switching circuit TB can be connected to the fuse element 101. The switching circuit TC can be connected to the switching circuit TB. The switching circuit TC can be connected to ground.

In some embodiments, the switching circuits TA, TB, TC, TD, and TE can be switches, transistors, or other switchable circuits.

Figure 2A:
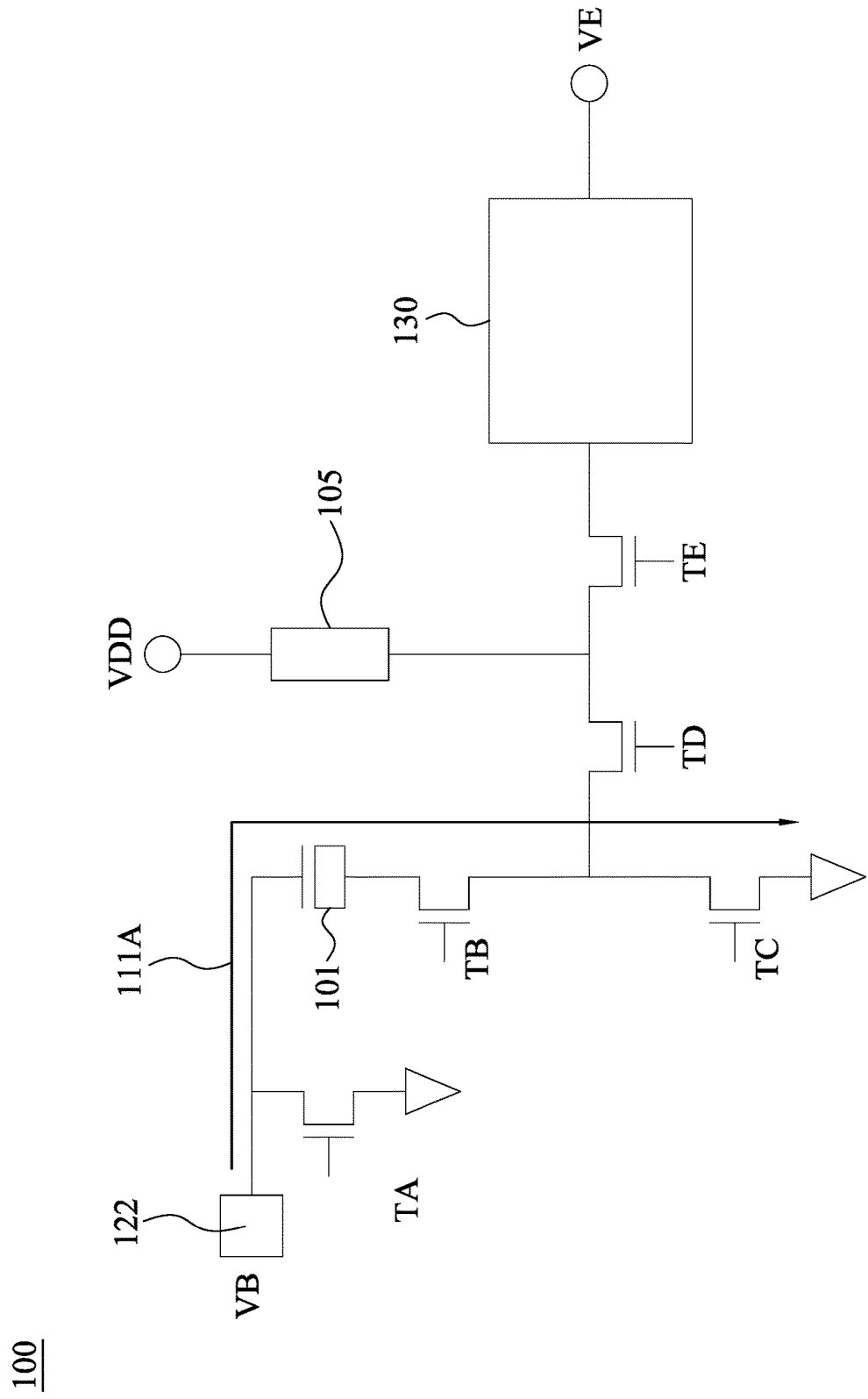
FIG. 2A is a schematic diagram of a semiconductor device, in accordance with some embodiments of the present disclosure.

FIG. 2A shows a semiconductor device 100, in accordance with some embodiments of the present disclosure. Referring to FIG. 2A, the switching circuits TB and TC are configured to be turned on to establish a conductive path 111A in response to the status-setting signal VB. In some embodiments, the conductive path 111A can pass through the fuse element 101 to ground in response to the status-setting signal VB. In some embodiments, when the status-setting signal VB is applied to the conductive terminal 122, the conductive path 111A passes through the fuse element 101, the switching circuits TB and TC, and to ground. In addition, the switching circuits TA, TD, and TE can be configured to be turned off, such that the conductive path 111A can pass through the fuse element 101.

In some embodiments, the status-setting signal VB may be a voltage signal or a current signal. In some embodiments, the status-setting signal VB may be a voltage signal having a voltage exceeding the normal operating voltage of the semiconductor device 100. For example, the status-setting signal VB can have a voltage in a range of 4-6V. In one embodiment, the status-setting signal VB can have a voltage in a range of 5-6V. When the status-setting signal VB is applied, a status of the fuse element 101 may be changed. Before the status-setting operation, the fuse element 101 may have a relatively high resistance. After the status-setting operation, the fuse element 101 may have a relatively low resistance. In the present disclosure, a fuse element before the status-setting operation can be referred to as an "unblown" fuse element, and a fuse element after the status-setting operation can be referred to as a "blown" fuse element.

The blown fuse element 101 has a resistance lower than the resistance of the unblown fuse element 101. In some embodiments, the fuse element 101 can be an anti-fuse. For example, the anti-fuse may be an e-fuse. In some embodiments, the anti-fuse includes a polysilicon e-fuse or other type of anti-fuse.

In one embodiment, the resistance of the unblown fuse element 101 can be in a range of 1.5M to 20MΩ. In another embodiment, the resistance of the unblown fuse element 101 may be in a range of 5M to 20MΩ. In some embodiments, the resistance of the unblown fuse element 101 may exceed 20MΩ. After the status-setting operation, the resistance of the blown fuse element 101 can be around 2k to 800kΩ. In one embodiment, the resistance of the blown fuse element 101 can be around 2k to 20kΩ. In another embodiment, the resistance of the blown fuse element 101 may exceed 100kΩ. In some embodiments, the resistance of the blown fuse element 101 can be around 100k to 800kΩ.

Figure 2B:
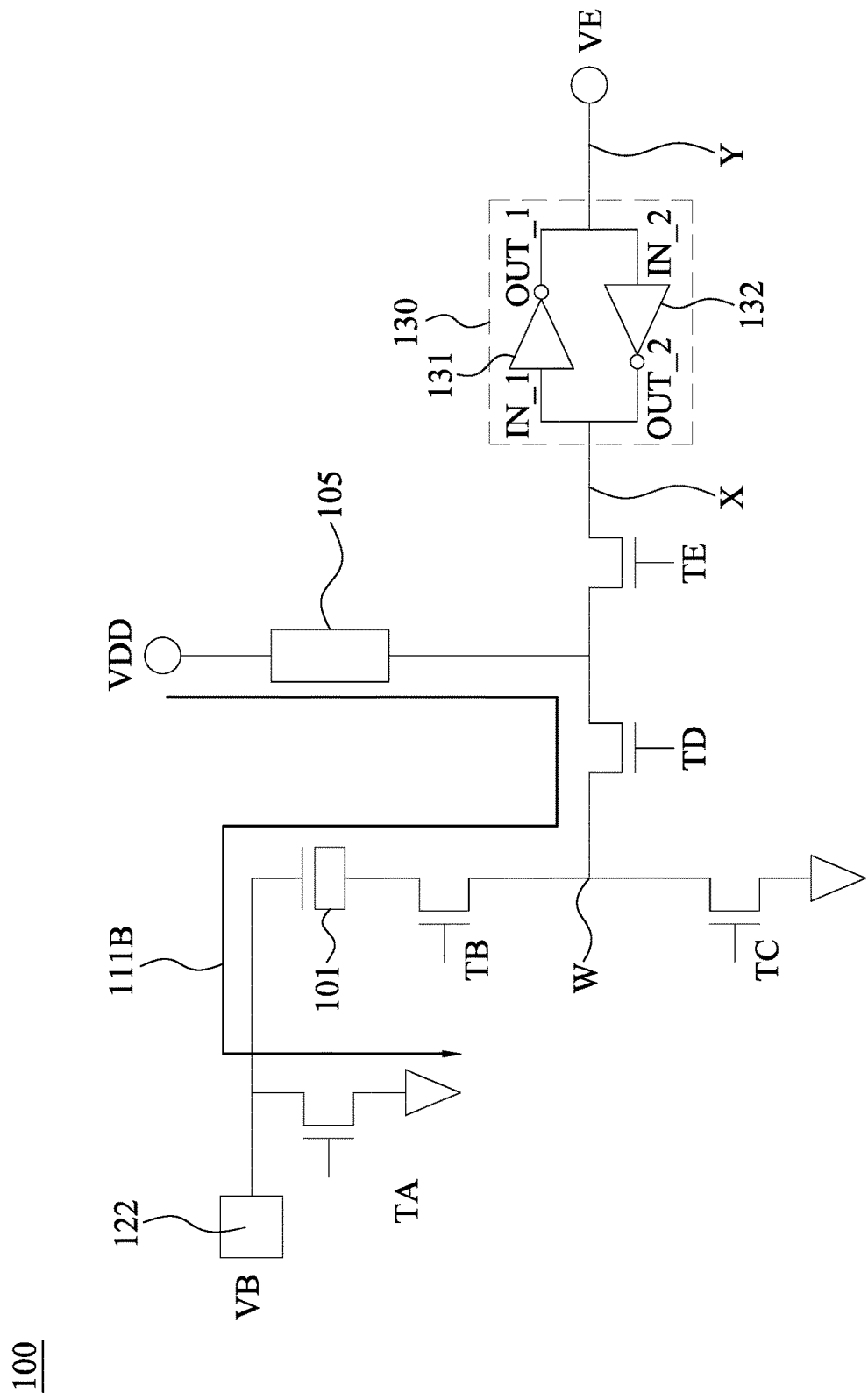
FIG. 2B is a schematic diagram of a semiconductor device, in accordance with some embodiments of the present disclosure.

FIG. 2B is a schematic diagram of a semiconductor device 100, in accordance with some embodiments of the present disclosure. Referring to FIG. 2B, the switching circuits TA, TB and TD are configured to be turned on to establish a conductive path 111B. In some embodiments, the conductive path 111B can pass through the configurable reference resistor unit 105 and the fuse element 101 to ground in response to the power signal VDD. In some embodiments, the switching circuit TC is configured to be turned off so as to establish the conductive path 111B. In some embodiments, when the power signal VDD is applied to the terminal 105-1 of the configurable reference resistor unit 105, the conductive path 111B passes through the configurable reference resistor unit 105, the switching circuits TD and TB, the fuse element 101, and the switching circuit TA, to ground. In some embodiments, the power signal VDD can be a normal operating voltage. For example, the power signal VDD can have a voltage of around 1.2V.

In some embodiments, a signal X is generated at a node W between the configurable reference resistor 105 and the fuse element 101, in response to the power signal VDD. Referring to FIG. 2B, the signal X generated at the node W can be transmitted to the latch circuit 130, through the switching circuits TD and TE.

In some embodiments, the latch circuit 130 is configured to read the signal X generated at the node W between the configurable reference resistor 105 and the fuse element 101. The node W is between the configurable reference resistor 105 and the fuse element 101 with or without other elements coupled therebetween. For example, the node W may be between the switching circuits TB and TD. In one embodiment, the node W may be between the switching circuit TD and the configurable reference resistor unit 105. In another embodiment, the node W may be between the switching circuit TB and the fuse element 101. In some embodiments, the signal X may include a voltage signal or a current signal.

In some embodiments, the switching circuit TE is configured to be turned on to transmit the signal X to the latch circuit 130. During an evaluation period, when the switching circuits TA, TB, TD, and TE are configured to be turned on to establish the conductive path 111B, the signal X can be obtained at the node W and transmit to the latch circuit 130. In some embodiments, the latch circuit 130 can read the signal X. In some embodiments, the latch circuit 130 can transform the signal X into a signal Y. For example, the transformation of the signal X operated by the latch circuit 130 may include inverting a signal into another. In one embodiment, the transformation of the signal X operated by the latch circuit 130 may include phase shifting. In another embodiment, the transformation of the signal X operated by the latch circuit 130 may include amplification.

In some embodiments, the latch circuit 130 can convert the analog signal X to a logic signal Y. The latch circuit 130 can compare the signal X with a threshold, and, based on the result of the comparison between the signal X and the threshold, output the signal Y. For example, when the signal X exceeds the threshold, the latch circuit 130 may output a logic low signal Y. On the contrary, when the signal X is lower than the threshold, the latch circuit 130 may output a logic high signal Y. In some embodiments, the signal Y has a logic value opposite to that of the signal X. For example, when the signal X is logic "0," the signal Y will be logic "1." On the contrary, when the signal X is logic "1," the signal Y will be logic "0." In some embodiments, the latch circuit 130 can store the signal Y.

Referring to FIG. 2B, the latch circuit 130 can include two inverters 131 and 132. In some embodiments, the latch circuit 130 can include more than two inverters. In some embodiments, the latch circuit 130 may be latch circuit of other type. The inverter 131 has an input terminal IN_1 and an output terminal OUT_1. The inverter 132 has an input terminal IN_2 and an output terminal OUT_2. In some embodiments, the input terminal IN_1 of the inverter 131 can be coupled to the configurable reference resistor unit 105, through the switching circuit TE. The input terminal IN_1 of the inverter 131 can be coupled to the fuse element 101, through the switching circuits TB, TD, and TE. The output terminal OUT_1 of the inverter 131 can be coupled to the conductive terminal VE. In some embodiments, the input terminal IN_1 of the inverter 131 may connect to the output terminal OUT_2 of the inverter 132. The output terminal OUT_1 of the inverter 131 may connect to the input terminal IN_2 of the inverter 132. That is, the input terminal IN_2 of the inverter 132 can be coupled to the conductive terminal VE. The output terminal OUT_2 of the inverter 132 can be coupled to the configurable reference resistor unit 105. The output terminal OUT_2 of the inverter 132 can be coupled to the fuse element 101.

To evaluate the status of the fuse element 101 (i.e., whether the fuse element 101 is blown), the signal X (or signal Y) is monitored. The signal X is compared with a predetermined signal or a threshold. Based on the comparison of the signal X and the predetermined signal, the logic signal Y can be output at the conductive terminal VE. When the signal X exceeds the predetermined signal, it indicates that the fuse element 101 is not blown. When the signal X fails to exceed the predetermined signal, it indicates that the fuse element 101 is blown.

In some embodiments, if the signal X exceeds the predetermined signal, the latch circuit 130 can output a logic low signal Y. That is, the logic low signal Y indicates that the fuse element 101 is not blown. When the signal X is lower than the predetermined signal, the latch circuit 130 may output a logic high signal Y. In other words, logic high signal Y indicates that the fuse element 101 is blown.

The signal Y may be obtained at the conductive terminal VE, such that the status of the fuse element 101 can be determined. The status of the fuse element 101 can be utilized to determine whether the semiconductor device is a redundant device or a normal device.

Figure 2C:
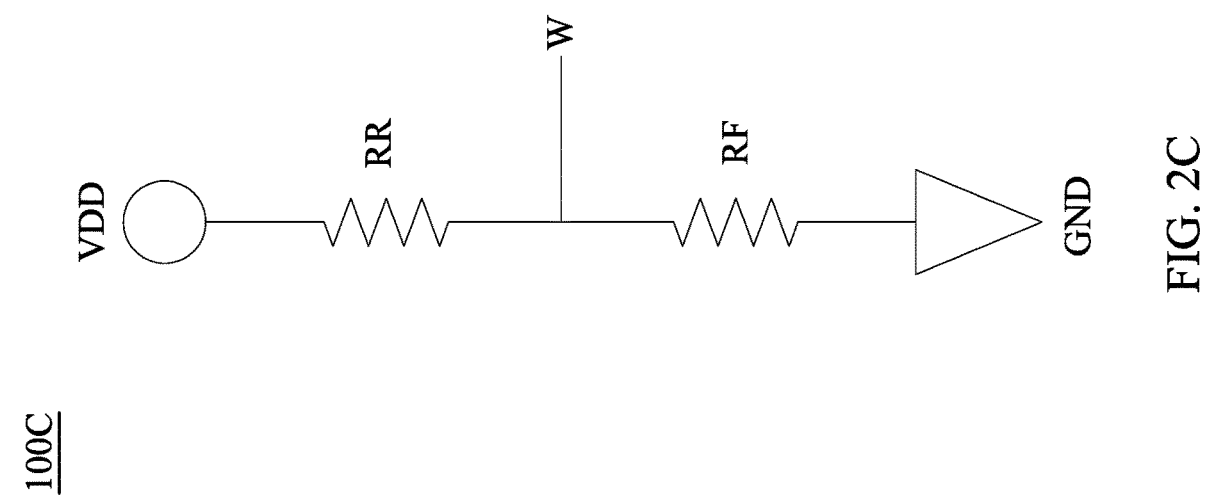
FIG. 2C illustrates an equivalent circuit of a portion of the semiconductor device shown in FIG. 2B, in accordance with some embodiments of the present disclosure.

FIG. 2C illustrates an equivalent circuit 100C of a portion of the semiconductor device 100 when the conductive path 111B is established, in accordance with the embodiments of the subject disclosure. The equivalent circuit 100C is configuration with switching circuits TA, TB and TD on and the switching circuit TC is off. In other words, the equivalent circuit 100C presents a simplified circuit through which the conductive path 111B passes.

The equivalent circuit 100C includes two resistors RR and RF. In some embodiments, the resistor RR can be the resistance of the configurable reference resistor unit 105. The resistor RF can be the resistance of the fuse element 101. In some embodiments, the resistor RR can be connected to the resistor RF in series. A node W is between the resistor RR and the resistor RF. That is, the node W in FIG. 2C corresponds to the node in FIG. 2B. In some embodiments, the resistor RR is configured to receive a power signal VDD. For example, the power signal VDD may be a voltage of 1.2V. In some embodiments, the resistor RF is connected to the resistor RR and the ground.

Referring to FIG. 2C, the signal X may be a voltage signal obtained at the node W. Therefore, the signal X can be calculated according to equation 1.

$$X = \frac{RF}{RR+RF}VDD, \qquad \text{[Equation. 1]}$$

In equation 1, X represents the voltage of the signal X; RR represents the resistance of the configurable reference resistor unit 105; RF represents the resistance of the fuse element 101; and VDD represents the power signal.

To evaluate the status of the fuse element 101 accurately, the resistance RR can fall below the resistance RF of the unblown fuse element. In addition, the resistance RR can exceed the resistance RF of the blown fuse element. In some embodiments, the resistance RR may be between the resistance of the unblown fuse element and the resistance of the blown fuse element.

In one embodiment, the resistance of the unblown fuse element 101 can be in a range of 1.5M to 20MΩ. In another embodiment, the resistance of the unblown fuse element 101 may be in a range of 5M to 20MΩ. In some embodiments, the resistance of the unblown fuse element 101 may exceed 20MΩ. After the status-setting operation, the resistance of the blown fuse element 101 can be 2k to 800kΩ. In one embodiment, the resistance of the blown fuse element 101 can be 2k to 20kΩ. In another embodiment, the resistance of the blown fuse element 101 may exceed 100kΩ. In some embodiments, the resistance of the blown fuse element 101 can be 100k to 800kΩ.

In some embodiments, the resistance of the resistor RR can be variable based on the resistance of the resistor RF. In some embodiments, the configurable reference resistor unit 105 has a variable resistance RR. For example, the resistance of the resistor RR may be adjusted to exceed that of the resistor RF of the blown fuse element. The resistor RR may be adjusted to fall below the resistor RF of the unblown fuse element.

When the resistor RR is adjusted between the resistance of the unblown fuse element and the blown fuse element, the status of the fuse element 101 can be determined accurately.

In some embodiments, the predetermined signal has a voltage less than that of the power signal VDD. In some embodiments, the predetermined signal has a voltage, which fractional times the power signal VDD. For example, if the predetermined signal has a voltage half of the power signal VDD, for example of 1.2V, the predetermined signal can have a voltage of 0.6V. That is, when the result of the equation 1 exceeds 0.6V, the signal X at the node W would be determined as logic high, indicating that the fuse element 101 is not blown, and when less than 0.6V, the signal X at the node W would be determined as logic low, representing the fuse element 101 is blown.

As resistance of the configurable reference resistor unit 105 is variable, the flexibility of the semiconductor device is increased. The resistor RR can be adjusted according to the resistor RF following manufacture. Therefore, inaccurate determination of the status of the fuse element 101 from unstable resistance of the fuse element resulting from process variants can be avoided. With no need to restart manufacture to adjust the resistor RR, production time is reduced. Therefore, the subject disclosure provides a more flexible semiconductor device/circuit, which can reduce production time.

Figure 3:
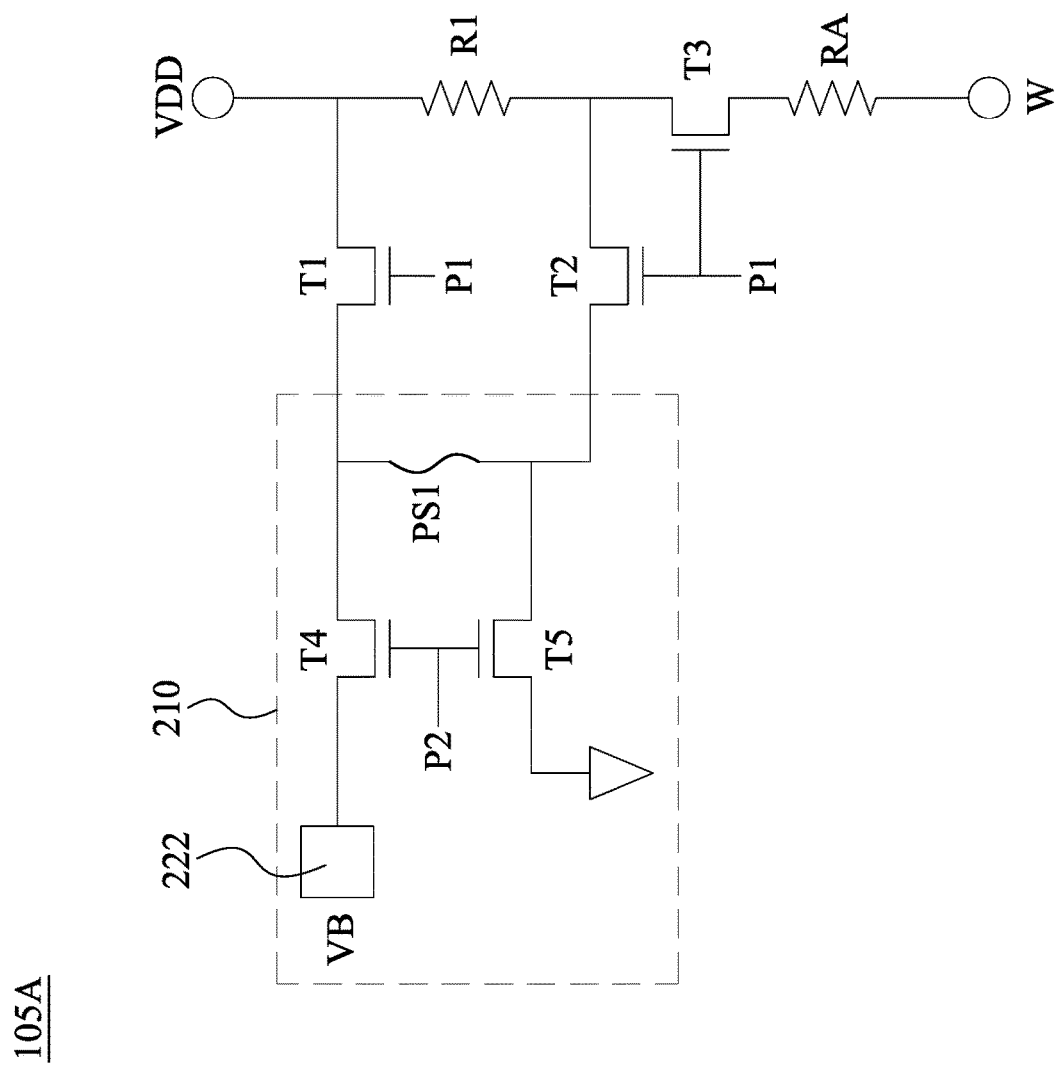
FIG. 3 is a block diagram of a configurable reference resistor unit, in accordance with some embodiments of the present disclosure.

FIG. 3 is a block diagram of a configurable reference resistor unit 105A, in accordance with some embodiments of the present disclosure. The reference resistor unit 105A can be an embodiment of the reference resistor unit 105 shown in FIGS. 2, 2A, and 2B. As shown in FIG. 3, the configurable reference resistor unit 105A may include resistors R1 and RA, a disconnect switch PS1, transistors T1, T2, and T3, and a status-setting circuit 210. The status-setting circuit 210 is configured to set the status of the disconnect switch PS1. In some embodiments, the status-setting circuit 210 includes the disconnect switch PS1, transistors T4 and T5, and a conductive contact 222.

In some embodiments, the resistor R1 is configured to receive the power signal VDD. The resistor R1 can be connected to the resistor RA. In some embodiments, the resistor RA can be connected in series with the resistor R1, through the transistor T3. The disconnect switch PS1 is connected to the resistor R1. For example, the disconnect switch PS1 can be connected in parallel with the resistor R1. The disconnect switch PS1 may be coupled to the resistor RA. In some embodiments, the disconnect switch PS1 may be an e-fuse. For example, the disconnect switch PS1 may include a metal e-fuse or a polysilicon e-fuse (poly e-fuse). Before the disconnect switch PS1 is blown, the disconnect switch PS1 has a low resistance, such that it can be regarded as a short circuit. In some embodiments, such disconnect switch PS1 may be an open circuit once it is blown.

The resistor R1 may have a resistance identical to that of the resistor RA. In one embodiment, the resistance of the resistor R1 can exceed that of the resistor RA. In another embodiment, the resistance of the resistor R1 can fall below that of the resistor RA. In some embodiments, the resistance of the resistor R1 may be mega-$\Omega$ level. In some embodiments, the resistance of the resistor R1 can be 0.1M, 0.2M, 0.3M, 0.5M, 1M, 2M, 3M, 4M, 5M, 6M, 7M, 8M$\Omega$, or more. In some embodiments, the resistance of the resistor RA can be 0.1M, 0.2M, 0.3M$\Omega$, or more. The resistance of the resistors RA and R1 can be configured according to design need.

In some embodiments, the transistor T1 is coupled between the resistor R1 and the disconnect switch PS1. The transistor T1 has a gate configured to receive a control signal P1. In some embodiments, the transistor T2 is coupled between the disconnect switch PS1 and the resistor R1. In some embodiments, the transistor T2 is coupled between the disconnect switch PS1 and the resistor RA. The transistor T2 has a gate configured to receive the control signal P1. In some embodiments, the transistor T3 is coupled between the resistor R1 and the resistor RA. The transistor T3 has a gate configured to receive the control signal P1.

In some embodiments, in response to the control signal P1, the transistors T1, T2, and T3 are configured to be turned on to generate the signal X at the node W. The node W in FIG. 3 has a signal corresponding to that generated at the node W in FIG. 2B. In some embodiments, a resistance of the configurable reference resistor unit 105A is associated with a status of the disconnect switch PS1. In some embodiments, a resistance of the configurable reference resistor unit 105A ranges between a resistance of the resistor RA and a sum resistance of the resistor R1 and the resistor RA. When the disconnect switch PS1 is not yet blown, since the disconnect switch PS1 is regarded as a short circuit, the resistance of the configurable reference resistor unit 105A may be the resistance of the resistor RA. On the contrary, when the disconnect switch PS1 is blown, since the disconnect switch PS1 is regarded as open, the resistance of the configurable reference resistor unit 105A may be a sum resistance of the resistor RA and the resistor R1. Therefore, the resistance of the configurable reference resistor unit 105A can be adjusted.

Referring to FIG. 3, the status-setting circuit 210 is intended to blow the disconnect switch PS1. In some embodiments, the disconnect switch PS1 can be coupled to the conductive contact 222 to receive a status-setting signal VB. The status-setting signal VB in FIG. 3 can be similar to the status-setting signal VB in FIG. 2. In some embodiments, the status-setting signal VB may have a voltage capable of blowing the disconnect switch PS1. That is, the status-setting signal VB may have a voltage in a range of 4-6V. In another embodiment, the status-setting signal VB can have a voltage in a range of 5-6V. In some embodiments, the transistor T4 can be coupled between the conductive contact 222 and the disconnect switch PS1. The transistor T4 has a gate configured to receive a control signal P2. In some embodiments, the transistor T5 can be coupled between the disconnect switch PS1 and the ground. The transistor T5 has a gate configured to receive the control signal P2.

Figure 3A:
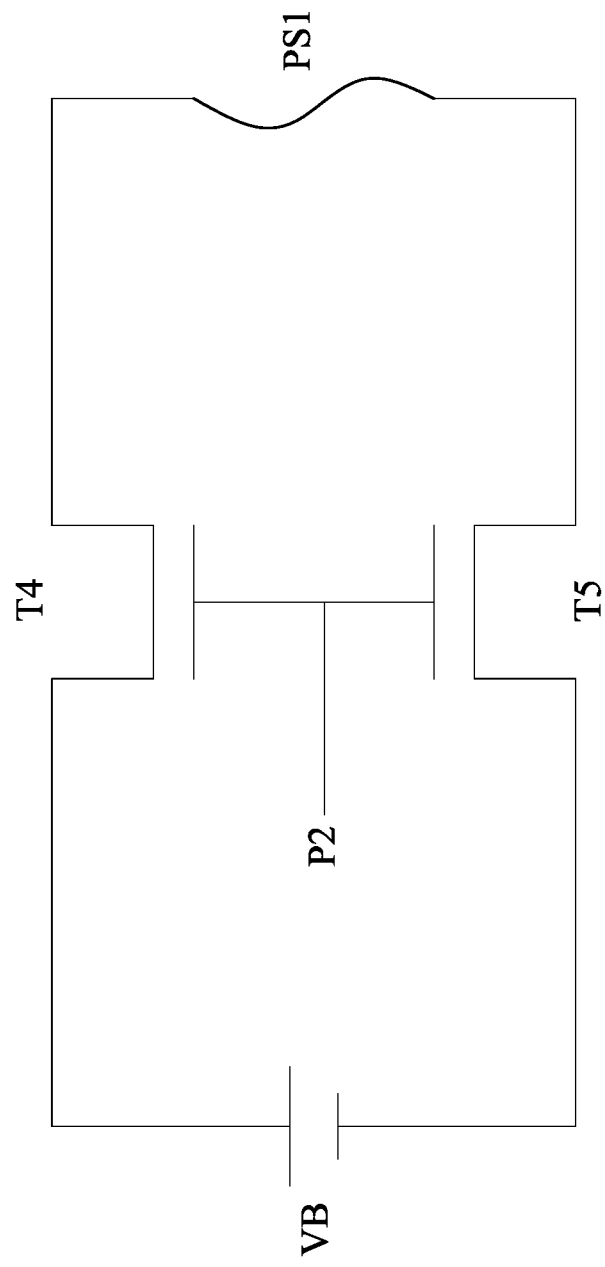
FIG. 3A is a block diagram of a status-setting circuit as shown in FIG. 3, in accordance with some embodiments of the present disclosure.

FIG. 3A is a block diagram of a status-setting circuit 210a, in accordance with some embodiments of the present disclosure. The status-setting circuit 210a in FIG. 3A is similar to the status-setting circuit 210 in FIG. 3, differing in that in FIG. 3A, the conductive contact 222 is replaced by a power supply for better understanding, wherein the power supply also provides the status-setting signal VB. In some embodiments, the power supply may be a voltage supply. In some embodiments, the power supply may be a current supply.

In some embodiments, in response to the control signal P2, the transistors T4 and T5 are configured to be turned on, such that the status-setting signal VB may be applied to the disconnect switch PS1. With the status-setting signal VB applied to the disconnect switch PS1, a status of the disconnect switch PS1 may be changed. In some embodiments, the disconnect switch PS1 can be blown under the status-setting signal VB.

Referring back to FIG. 3, the number of resistors included in the configurable reference resistor unit 105A may be more than two. As more resistors are included in the configurable reference resistor unit 105A, flexibility of the variable resistance increases.

Figure 4:
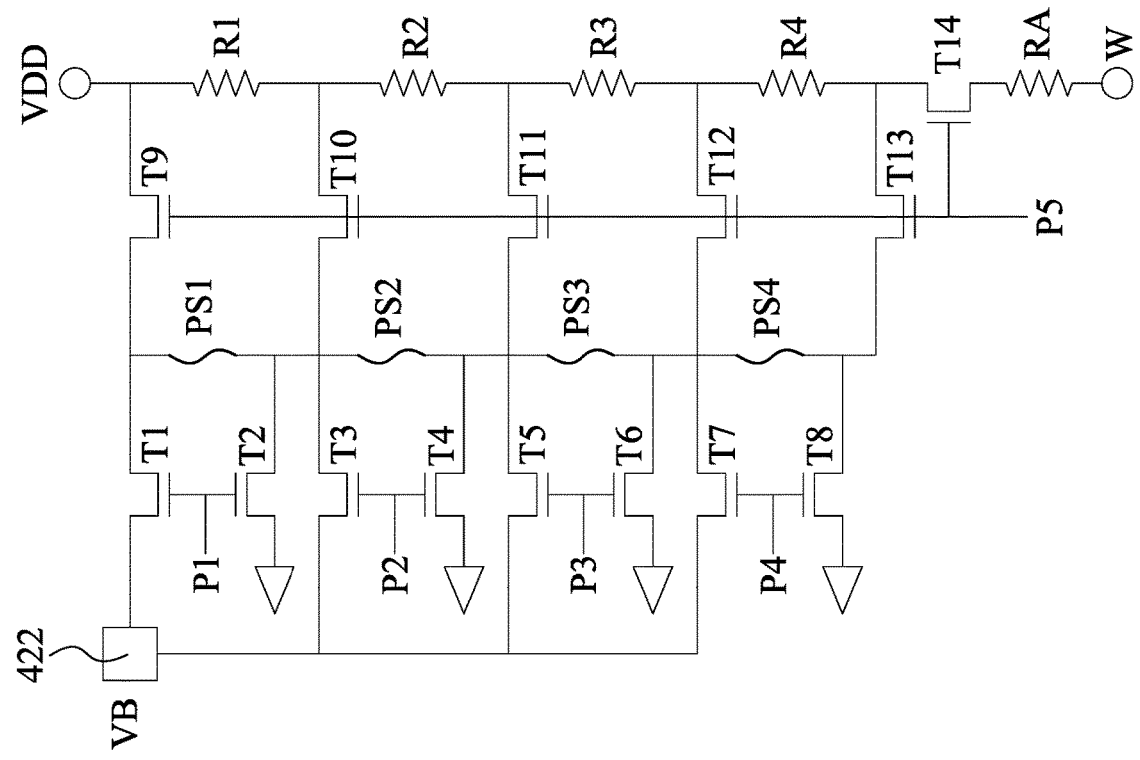
FIG. 4 is a block diagram of a configurable reference resistor unit, in accordance with some embodiments of the present disclosure.

FIG. 4 is a block diagram of a configurable reference resistor unit 405, in accordance with some embodiments of the present disclosure. The configurable reference resistor unit 405 in FIG. 4 is similar to the configurable reference resistor unit 105A in FIG. 3, differing in that in FIG. 4, the configurable reference resistor unit 405 includes more resistors and disconnect switches for better flexibility.

As shown in FIG. 4, the configurable reference resistor unit 405 may include resistors R1, R2, R3, R4 and RA, disconnect switches PS1, PS2, PS3 and PS4, transistors T1, T2, T3, T4, T5, T6, T7, T8, T9, T10, T11, T12, T13 and T14, and a conductive contact 422.

In some embodiments, the resistor R1 is configured to receive the power signal VDD. The resistor R1 can be connected to the resistor R2. In some embodiments, the resistor R1 can be connected in series with the resistor R2. The disconnect switch PS1 is connected to the resistor R1. For example, the disconnect switch PS1 may be connected in parallel with the resistor R1. The disconnect switch PS1 may be coupled to the resistor R2.

The resistor R2 can be connected to the resistor R3. In some embodiments, the resistor R2 can be connected in series with the resistor R3. The disconnect switch PS2 is connected to the resistor R2. For example, the disconnect switch PS2 may be connected in parallel with the resistor R2. The disconnect switch PS2 may be coupled to the resistor R3. In some embodiments, the disconnect switch PS2 may be connected in series with the disconnect switch PS1.

The resistor R3 can be connected to the resistor R4. In some embodiments, the resistor R3 can be connected in series with the resistor R4. The disconnect switch PS3 is connected to the resistor R3. For example, the disconnect switch PS3 may be connected in parallel with the resistor R3. The disconnect switch PS3 may be coupled to the resistor R4. In some embodiments, the disconnect switch PS3 may be connected in series with the disconnect switch PS2.

The resistor R4 can be connected to the resistor RA, through the transistor T14. In some embodiments, the resistor R4 can be connected in series with the resistor RA. The disconnect switch PS4 is connected to the resistor R4. For example, the disconnect switch PS4 may be connected in parallel with the resistor R4. The disconnect switch PS4 may be coupled to the resistor RA. In some embodiments, the disconnect switch PS4 may be connected in series with the disconnect switch PS3.

In some embodiments, the disconnect switches PS1, PS2, PS3 and PS4 are similar to the disconnect switch PS1 in FIG. 3, and thus detailed description thereof is not repeated here.

The resistors R1, R2, R3, R4, and RA can have the same resistance. In some embodiments, the resistors R1, R2, R3, R4, and RA can have different resistances. For example, the resistance of the resistor R1 can exceed the resistor R2. The resistance of the resistor R1 can fall below the resistor R2. In some embodiments, the resistance of the resistors R1, R2, R3, and R4 can each be 0.1M, 0.2M, 0.3M, 0.5M, 1M, 2M, 3M, 4M, 5M, 6M, 7M, 8MΩ, or more. In some embodiments, the resistance of the resistor RA can be 0.1M, 0.2M, 0.3MΩ, or more. The resistance of the resistors R1, R2, R3, R4 and RA can be selected according to design need.

In some embodiments, the transistor T9 is coupled between the resistor R1 and the disconnect switch PS1. The transistor T9 has a gate configured to receive a control signal P5. In some embodiments, the transistor T10 is coupled between the disconnect switch PS2 and the resistor R2. The transistor T10 has a gate configured to receive the control signal P5. In some embodiments, the transistor T11 is coupled between the disconnect switch PS3 and the resistor R3. The transistor T11 has a gate configured to receive the control signal P5. In some embodiments, the transistor T12 is coupled between the disconnect switch PS4 and the resistor R4. The transistor T12 has a gate configured to receive the control signal P5. In some embodiments, the transistor T13 is coupled between the disconnect switch PS4 and the resistor RA. The transistor T13 has a gate configured to receive the control signal P5. In some embodiments, the transistor T14 is coupled between the resistor R4 and the resistor RA. The transistor T14 has a gate configured to receive the control signal P5.

In some embodiments, in response to the control signal P5, the transistors T9, T10, T11, T12, T13 and T14 are configured to be turned on to generate the signal X at the node W. In some embodiments, a resistance of the configurable reference resistor unit 405 is associated with a status of each of the disconnect switches PS1, PS2, PS3, and PS4. In some embodiments, a resistance of the configurable reference resistor unit 405 ranges between a resistance of the resistor RA and a sum resistance of the resistors R1, R2, R3, R4, and RA.

Referring to FIG. 4, the disconnect switch PS1 can be coupled to the conductive contact 422 to receive a status-setting signal VB. The status-setting signal VB in FIG. 4 can be the same with the status-setting signal VB in FIG. 3. In some embodiments, the transistor T1 can be coupled between the conductive contact 422 and the disconnect switch PS1. The transistor T1 has a gate configured to receive a control signal P1. In some embodiments, the transistor T2 can be coupled between the disconnect switch PS1 and the ground. The transistor T2 has a gate configured to receive the control signal P1. In response to the control signal P1, the transistors T1 and T2 are configured to be turned on, such that the status-setting signal VB may be applied to the disconnect switch PS1. With the status-setting signal VB applied to the disconnect switch PS1, a status of the disconnect switch PS1 may be changed. In some embodiments, the disconnect switch PS1 can be blown by the status-setting signal VB.

In some embodiments, the disconnect switch PS2 can be coupled to the conductive contact 422 to receive the status-setting signal VB. In some embodiments, the transistor T3 can be coupled between the conductive contact 422 and the disconnect switch PS2. The transistor T3 has a gate configured to receive a control signal P2. In some embodiments, the transistor T4 can be coupled between the disconnect switch PS2 and the ground. The transistor T4 has a gate configured to receive the control signal P2. In response to the control signal P2, the transistors T3 and T4 are configured to be turned on, such that the status-setting signal VB may be applied to the disconnect switch PS2. With the status-setting signal VB applied to the disconnect switch PS2, a status of the disconnect switch PS2 may be changed. In some embodiments, the disconnect switch PS2 can be blown by the status-setting signal VB.

In some embodiments, the disconnect switch PS3 can be coupled to the conductive contact 422 to receive the status-setting signal VB. In some embodiments, the transistor T5 can be coupled between the conductive contact 422 and the disconnect switch PS3. The transistor T5 has a gate configured to receive a control signal P3. In some embodiments, the transistor T6 can be coupled between the disconnect switch PS3 and the ground. The transistor T6 has a gate configured to receive the control signal P3. In response to the control signal P3, the transistors T5 and T6 are configured to be turned on, such that the status-setting signal VB may be applied to the disconnect switch PS3. With the status-setting signal VB applied to the disconnect switch PS3, a status of the disconnect switch PS3 may be changed. In some embodiments, the disconnect switch PS3 can be blown by the status-setting signal VB.

In some embodiments, the disconnect switch PS4 can be coupled to the conductive contact 422 to receive the status-setting signal VB. In some embodiments, the transistor T7 can be coupled between the conductive contact 422 and the disconnect switch PS4. The transistor T7 has a gate configured to receive a control signal P4. In some embodiments, the transistor T8 can be coupled between the disconnect switch PS4 and the ground. The transistor T8 has a gate configured to receive the control signal P4. In response to the control signal P4, the transistors T7 and T8 are configured to be turned on, such that the status-setting signal VB may be applied to the disconnect switch PS4. With the status-setting signal VB applied to the disconnect switch PS4, a status of the disconnect switch PS4 may be changed. In some embodiments, the disconnect switch PS4 can be blown by the status-setting signal VB.

According to need, the resistance of the configurable reference resistor unit 405 can be adjusted by blowing one or more of the disconnect switches PS1, PS2, PS3, and PS4. In some embodiments, the configurable reference resistor unit 405 includes sixteen configurations. Each configuration provides a different overall resistance. The detail of the configurations of the configurable reference resistor unit 405 is provided in Table 1 as follows. In Table 1, columns PS1, PS2, PS3 and PS4 list the status of corresponding disconnect switch, wherein "0" represents unblown and "1" represents blown status. The column Total resistance shows the overall resistance of the configurable reference resistor unit 405 under each configuration.

TABLE 1

| Configuration | PS1 | PS2 | PS3 | PS4 | Total resistance |
|---|---|---|---|---|---|
| 1 | 0 | 0 | 0 | 0 | RA |
| 2 | 1 | 0 | 0 | 0 | R1 + RA |
| 3 | 0 | 1 | 0 | 0 | R2 + RA |
| 4 | 0 | 0 | 1 | 0 | R3 + RA |
| 5 | 0 | 0 | 0 | 1 | R4 + RA |
| 6 | 1 | 1 | 0 | 0 | R1 + R2 + RA |
| 7 | 1 | 0 | 1 | 0 | R1 + R3 + RA |
| 8 | 1 | 0 | 0 | 1 | R1 + R4 + RA |
| 9 | 0 | 1 | 1 | 0 | R2 + R3 + RA |
| 10 | 0 | 1 | 0 | 1 | R2 + R4 + RA |
| 11 | 0 | 0 | 1 | 1 | R3 + R4 + RA |
| 12 | 1 | 1 | 1 | 0 | R1 + R2 + R3 + RA |
| 13 | 1 | 1 | 0 | 1 | R1 + R2 + R4 + RA |
| 14 | 1 | 0 | 1 | 1 | R1 + R3 + R4 + RA |
| 15 | 0 | 1 | 1 | 1 | R2 + R3 + R4 + RA |
| 16 | 1 | 1 | 1 | 1 | R1 + R2 + R3 + R4 + RA |

In some embodiments, the resistor R1 can be 1MΩ; the resistor R2 can be 2MΩ; the resistor R3 can be 4MΩ; the resistor R4 can be 8MΩ; and the resistor RA can be 0.3MΩ. Accordingly, the total resistance may be variable in a range of 0.3 to 15.3MΩ. Furthermore, the total resistance of each configuration in this example is provided in Table 1A as follows.

TABLE 1A

| Configuration | PS1 | PS2 | PS3 | PS4 | Total resistance (MΩ) |
|---|---|---|---|---|---|
| 1 | 0 | 0 | 0 | 0 | 0.3 |
| 2 | 1 | 0 | 0 | 0 | 1.3 |
| 3 | 0 | 1 | 0 | 0 | 2.3 |
| 4 | 0 | 0 | 1 | 0 | 4.3 |
| 5 | 0 | 0 | 0 | 1 | 8.3 |
| 6 | 1 | 1 | 0 | 0 | 3.3 |
| 7 | 1 | 0 | 1 | 0 | 5.3 |
| 8 | 1 | 0 | 0 | 1 | 9.3 |
| 9 | 0 | 1 | 1 | 0 | 6.3 |
| 10 | 0 | 1 | 0 | 1 | 10.3 |
| 11 | 0 | 0 | 1 | 1 | 12.3 |
| 12 | 1 | 1 | 1 | 0 | 7.3 |
| 13 | 1 | 1 | 0 | 1 | 11.3 |
| 14 | 1 | 0 | 1 | 1 | 13.3 |
| 15 | 0 | 1 | 1 | 1 | 14.3 |
| 16 | 1 | 1 | 1 | 1 | 15.3 |

As shown in FIG. 4, disconnect switches PS1, PS2, PS3, and PS4 are unblown. FIG. 4 can represent Configuration 1 listed in the Table 1 and Table 1A. That is, the total resistance of the configurable reference resistor 405 can be the same as the resistor RA. According to the embodiment of Table 1A, the total resistance of the configurable reference resistor 405 can be 0.3MΩ.

Figure 4A:
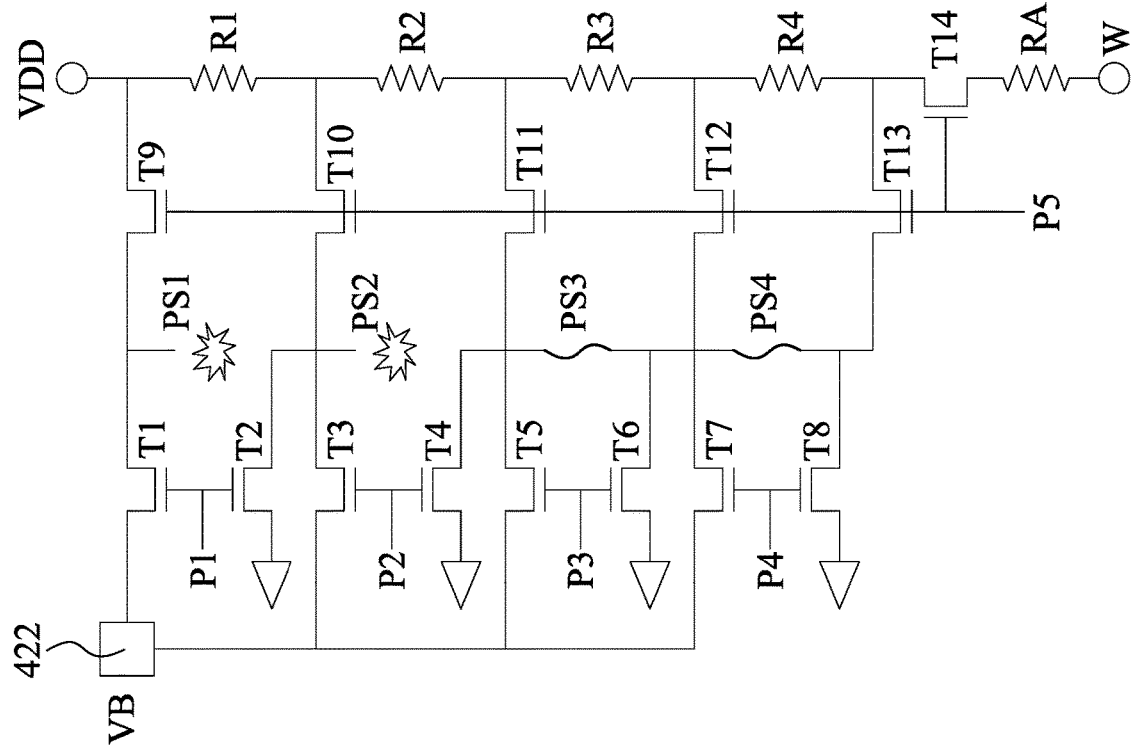
FIG. 4A illustrates configuration of the configurable reference resistor unit, in accordance with some embodiments of the present disclosure.

FIG. 4A illustrates configuration of the configurable reference resistor unit 405a, in accordance with some embodiments of the present disclosure. The configurable reference resistor unit 405a in FIG. 4A is similar to the configurable reference resistor unit 405 in FIG. 4, differing in that in FIG. 4A, the configurable reference resistor unit 405a includes the disconnect switches PS1 and PS2 being blown.

As shown in FIG. 4A, the disconnect switches PS1 and PS2 are blown. FIG. 4A illustrates Configuration 6 listed in Table 1 and Table 1A. That is, in this embodiment, the total resistance of the configurable reference resistor 405a is a sum of resistors R1, R2 and RA. According to the embodiment shown in Table 1A, the total resistance of the configurable reference resistor 405a can be 3.3MΩ.

Figure 4B:
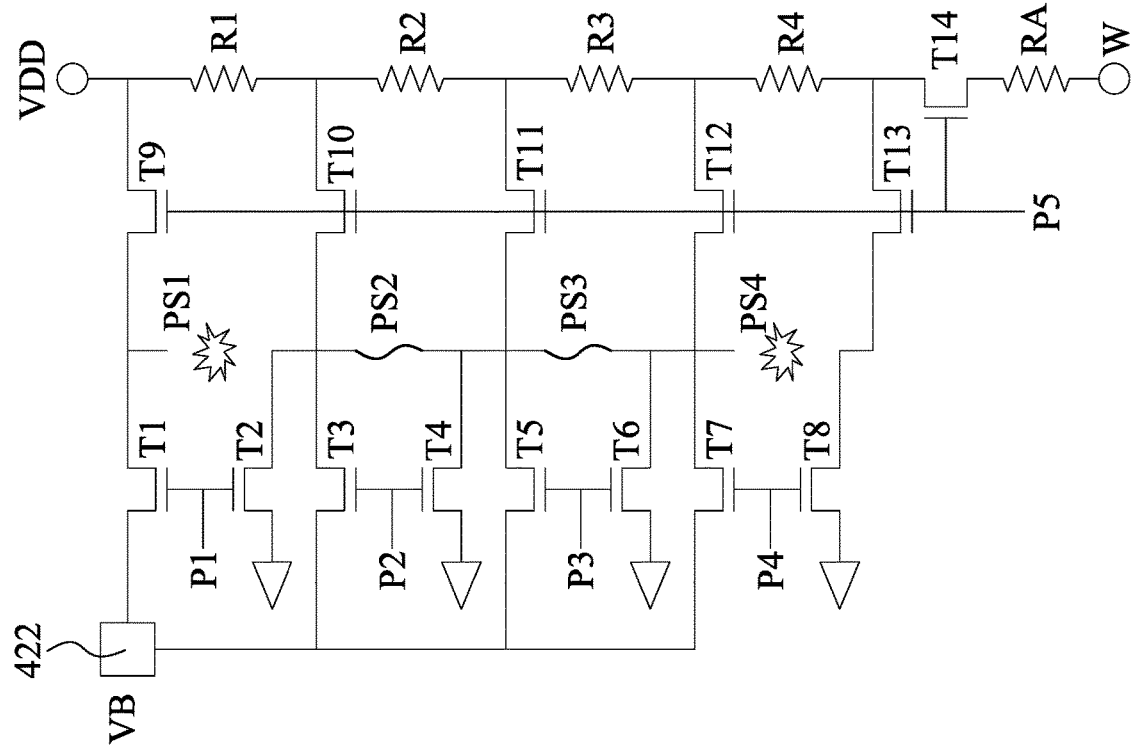
FIG. 4B illustrates configuration of the configurable reference resistor unit, in accordance with some embodiments of the present disclosure.

FIG. 4B illustrates configuration of the configurable reference resistor unit 405b, in accordance with some embodiments of the present disclosure. The configurable reference resistor unit 405b in FIG. 4B is similar to the configurable reference resistor unit 405 in FIG. 4, differing in that in FIG. 4B, the configurable reference resistor unit 405b includes the disconnect switches PS1 and PS4 being blown.

As shown in FIG. 4B, the disconnect switches PS1 and PS4 are blown. FIG. 4B illustrates Configuration 8 listed in Table 1 and Table 1A. That is, in this embodiment, the total resistance of the configurable reference resistor 405b is a sum of resistors R1, R4 and RA. According to the embodiment of Table 1A, the total resistance of the configurable reference resistor 405b can be 9.3MΩ.

Figure 4C:
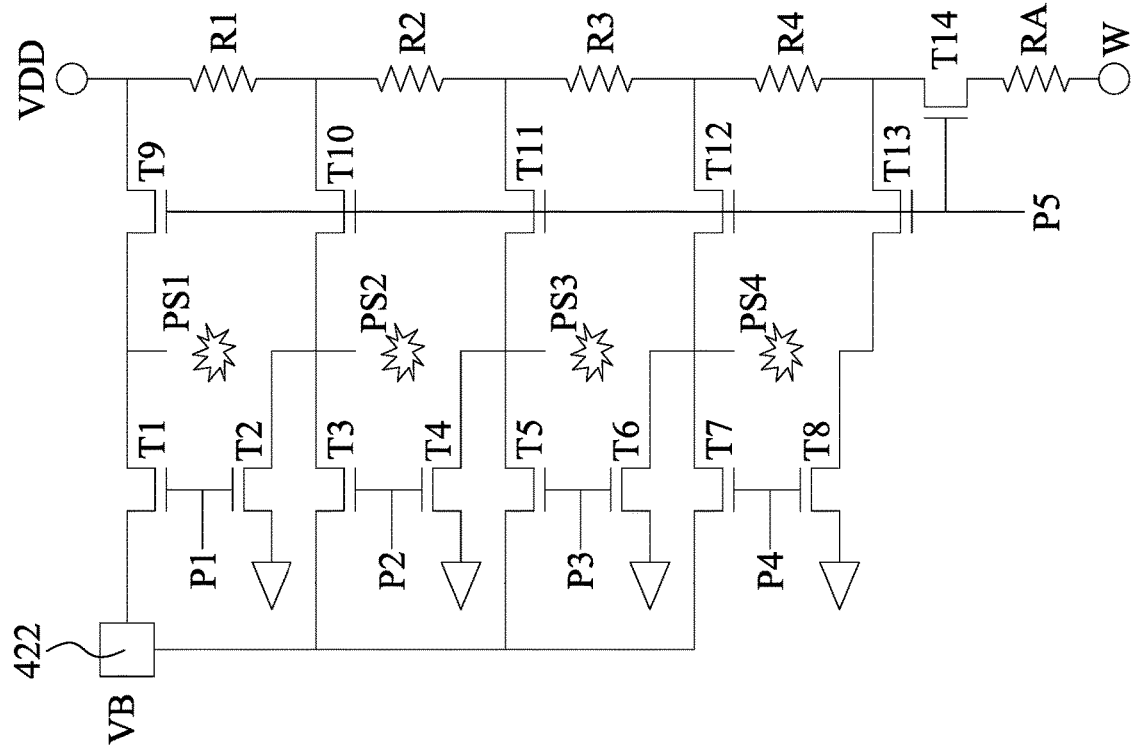
FIG. 4C illustrates configuration of the configurable reference resistor unit, in accordance with some embodiments of the present disclosure.

FIG. 4C illustrates configuration of the configurable reference resistor unit 405c, in accordance with some embodiments of the present disclosure. The configurable reference resistor unit 405c in FIG. 4C is similar to the configurable reference resistor unit 405 in FIG. 4, differing in that in FIG. 4C, the configurable reference resistor unit 405c includes the disconnect switches PS1, PS2, PS3, and PS4 being blown. In other words, all disconnect switches are blown in the configurable reference resistor unit 405c.

As shown in FIG. 4C, the disconnect switches PS1, PS2, PS3, and PS4 are blown. FIG. 4C illustrates Configuration 16 listed in Table 1 and Table 1A. That is, in this embodiment, the total resistance of the configurable reference resistor 405c is a sum of resistors R1, R2, R3, R4 and RA.

According to the embodiment of Table 1A, the total resistance of the configurable reference resistor 405c can be 15.3MΩ.

Figure 5:
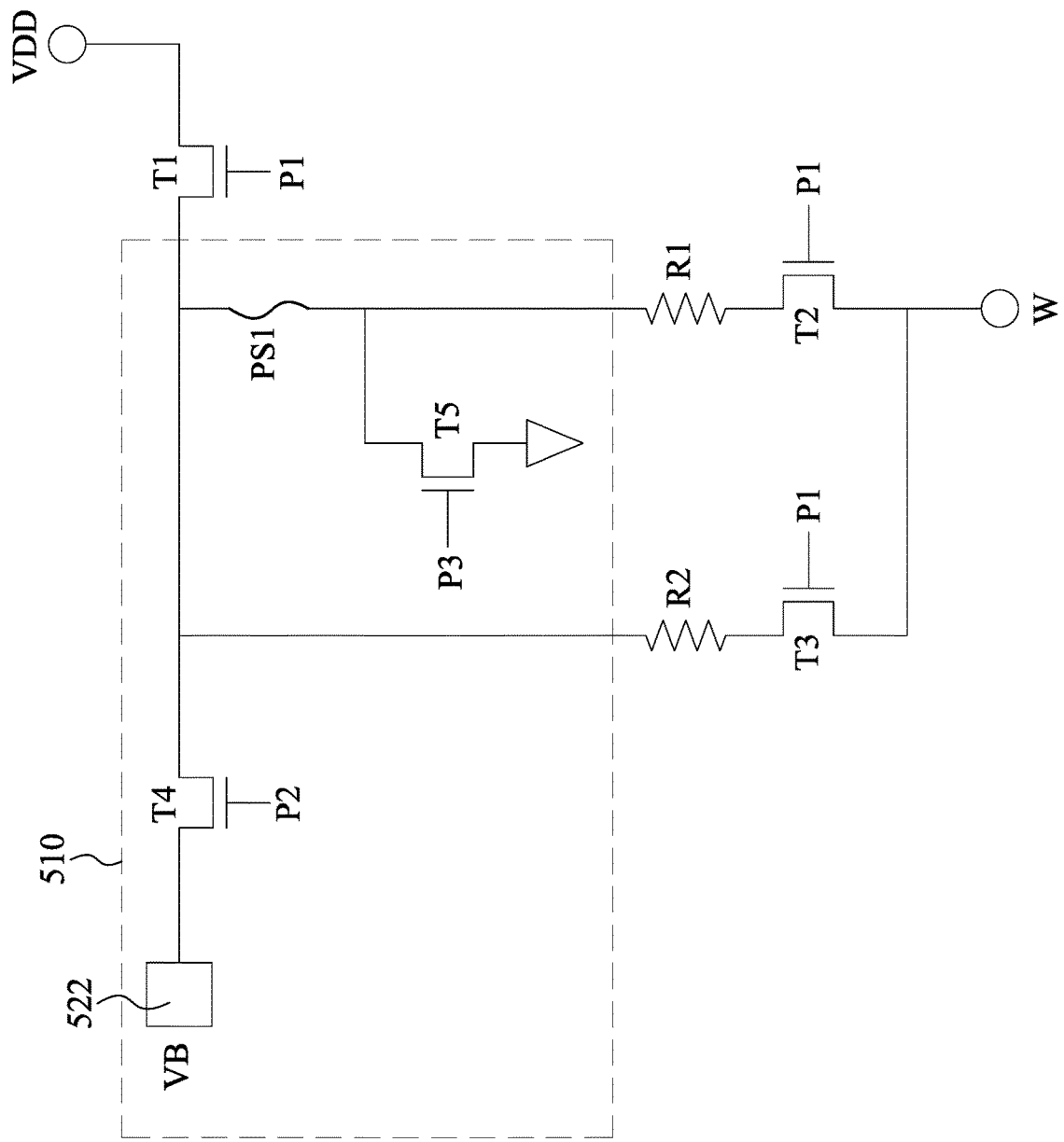
FIG. 5 is a block diagram of a configurable reference resistor unit, in accordance with some embodiments of the present disclosure.

FIG. 5 is a block diagram of a configurable reference resistor unit 105B, in accordance with some embodiments of the present disclosure. In some embodiments, the elements shown in FIG. 5 are similar to those of FIG. 3, but in a different arrangement. Accordingly, detailed descriptions of those elements in paragraphs associated with FIG. 3 can be applicable to those elements in FIG. 5, such as the disconnect switch PS1.

As shown in FIG. 5, the configurable reference resistor unit 105B may include two resistors R1 and R2, a disconnect switch PS1, three transistors T1, T2, and T3, and a status-setting circuit 510. The status-setting circuit 510 is configured to blow the disconnect switch PS1. In some embodiments, the status-setting circuit 510 includes the disconnect switch PS1, transistors T4 and T5, and a conductive contact 522.

In some embodiments, the resistor R1 is configured to receive the power signal VDD. The resistor R1 can be connected to the resistor R2. In some embodiments, the resistor R1 can be connected in parallel with the resistor R2. The disconnect switch PS1 is connected to the resistor R1. For example, the disconnect switch PS1 may be connected in series with the resistor R1. In some embodiments, the disconnect switch PS1 is configured to receive the power signal VDD.

The resistor R1 may have a resistance identical to that of the resistor R2. In one embodiment, the resistance of the resistor R1 can exceed the resistor R2. In another embodiment, the resistance of the resistor R1 can fall below the resistor R2. In some embodiments, the resistance of the resistors R1 and R2 may be mega-Ω level. In some embodiments, the resistance of the resistors R1 and R2 can each be 0.1M, 0.2M, 0.3M, 0.5M, 1M, 2M, 3M, 4M, 5M, 6M, 7M, 8MΩ, or greater than 8MΩ. The resistance of the resistors R1 and R2 can be determined according to need.

In some embodiments, the transistor T1 is coupled to the disconnect switch PS1. The transistor T1 has a gate configured to receive a control signal P1. In some embodiments, the transistor T2 is coupled to the resistor R1. The transistor T2 has a gate configured to receive the control signal P1. In some embodiments, the transistor T3 is coupled to the resistor R2. The transistor T3 has a gate configured to receive the control signal P1.

In some embodiments, in response to the control signal P1, the transistors T1, T2, and T3 are configured to be turned on to generate the signal X at the node W. In some embodiments, a resistance of the configurable reference resistor unit 105B is associated with a status of the disconnect switch PS1. When the disconnect switch PS1 is unblown, since the disconnect switch PS1 is regarded as shorted, the resistance of the configurable reference resistor unit 105B can be regarded as the parallel equivalent resistance of the resistors R1 and R2. On the contrary, when the disconnect switch PS1 is blown, since the disconnect switch PS1 is regarded as open, the resistance of the configurable reference resistor unit 105B can be the resistance of the resistor R2. Therefore, the resistance of the configurable reference resistor unit 105B is variable.

Referring to FIG. 5, the status-setting circuit 510 is intended to blow the disconnect switch PS1. In some embodiments, the disconnect switch PS1 can be coupled to the conductive contact 522 to receive a status-setting signal VB. In some embodiments, the status-setting signal VB may have a voltage capable of blowing the disconnect switch PS1. That is, the status-setting signal VB may have a voltage in a range of 4-6V. In another embodiment, the status-setting signal VB can have a voltage in a range of 5-6V. In some embodiments, the transistor T4 can be coupled between the conductive contact 522 and the disconnect switch PS1. The transistor T4 has a gate configured to receive a control signal P2. In some embodiments, the transistor T5 can be coupled between the disconnect switch PS1 and the ground. The transistor T5 has a gate configured to receive a control signal P3.

In some embodiments, in response to the control signals P2 and P3, the transistors T4 and T5 are configured to be turned on, such that the status-setting signal VB may be applied to the disconnect switch PS1. With the status-setting signal VB applied to the disconnect switch PS1, a status of the disconnect switch PS1 can be changed. In some embodiments, the disconnect switch PS1 can be blown by the status-setting signal VB.

Similarly, the number of the resistors included in the configurable reference resistor unit 105B may be more than two. As more resistors are included in the configurable reference resistor unit 105B, flexibility of the variable resistance increases.

Figure 6:
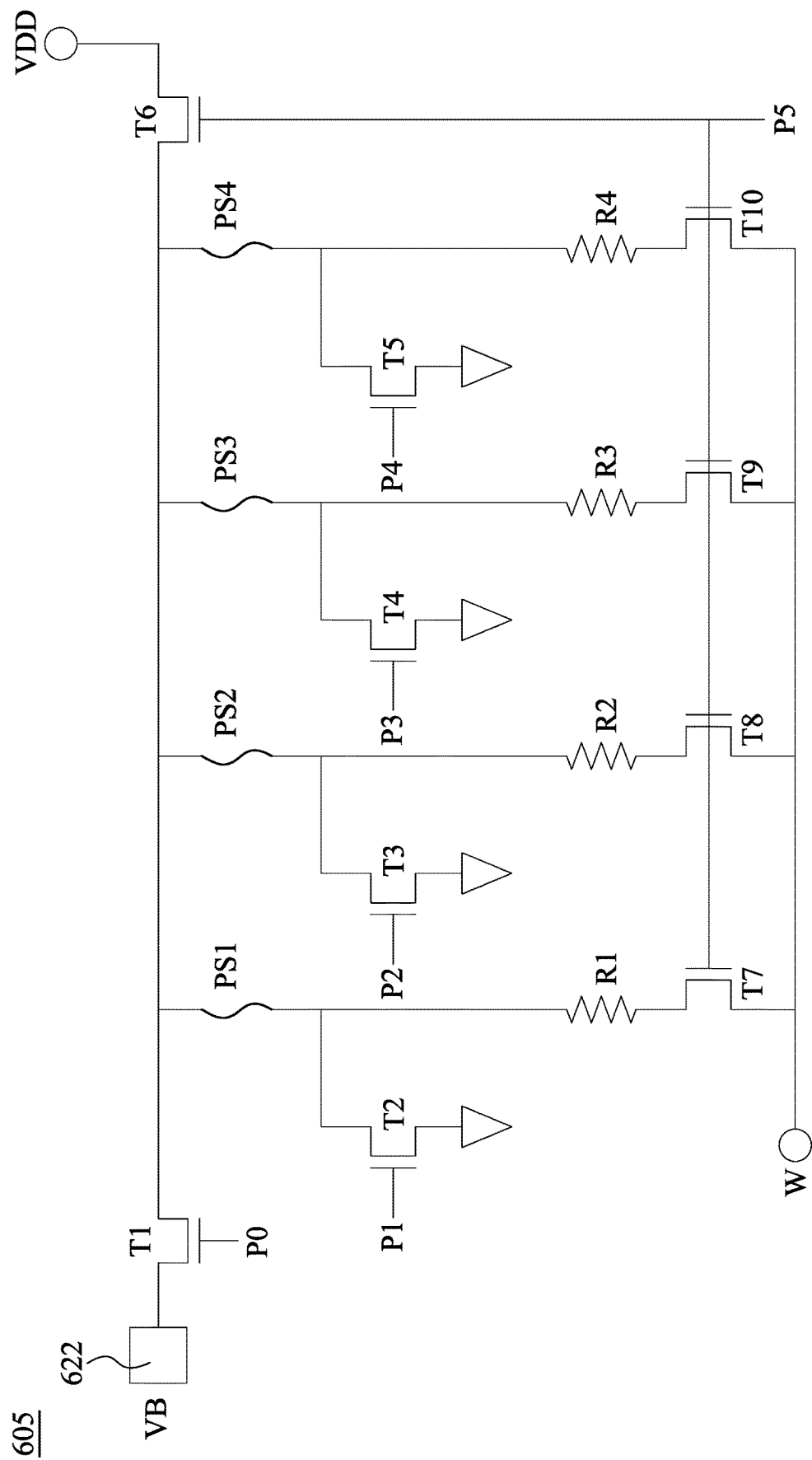
FIG. 6 is a block diagram of a configurable reference resistor unit, in accordance with some embodiments of the present disclosure.

FIG. 6 is a block diagram of a configurable reference resistor unit 605, in accordance with some embodiments of the present disclosure. The configurable reference resistor unit 605 in FIG. 6 is similar to the configurable reference resistor unit 105B in FIG. 5, differing in that in FIG. 6, the configurable reference resistor unit 605 includes more resistors and disconnect switches for better flexibility.

As shown in FIG. 6, the configurable reference resistor unit 605 may include resistors R1, R2, R3 and R4, disconnect switches PS1, PS2, PS3 and PS4, transistors T1, T2, T3, T4, T5, T6, T7, T8, T9 and T10, and a conductive contact 622.

In some embodiments, the resistor R1 is configured to receive the power signal VDD. The resistor R1 can be coupled to the resistor R2. In some embodiments, the resistor R1 can be connected in parallel with the resistor R2. The disconnect switch PS1 is connected to the resistor R1. For example, the disconnect switch PS1 may be connected in series with the resistor R1. In some embodiments, the disconnect switch PS1 is configured to receive the power signal VDD.

In some embodiments, the resistor R2 is configured to receive the power signal VDD. The resistor R2 can be coupled to the resistor R3. In some embodiments, the resistor R2 can be coupled in parallel with the resistor R3. The disconnect switch PS2 is coupled to the resistor R2. For example, the disconnect switch PS2 may be coupled in series with the resistor R2. In some embodiments, the disconnect switch PS2 is configured to receive the power signal VDD.

In some embodiments, the resistor R3 is configured to receive the power signal VDD. The resistor R3 can be coupled to the resistor R4. In some embodiments, the resistor R3 can be coupled in parallel with the resistor R4. The disconnect switch PS3 is coupled to the resistor R3. For example, the disconnect switch PS3 may be coupled in series with the resistor R3. In some embodiments, the disconnect switch PS3 is configured to receive the power signal VDD.

In some embodiments, the resistor R4 is configured to receive the power signal VDD. The disconnect switch PS4 is coupled to the resistor R4. For example, the disconnect switch PS4 may be coupled in series with the resistor R4. In some embodiments, the disconnect switch PS4 is configured to receive the power signal VDD.

In some embodiments, the disconnect switches PS1, PS2, PS3 and PS4 are similar to the disconnect switch PS1 in FIG. 5, and thus detailed description thereof is not repeated here.

The resistors R1, R2, R3, and R4 may have the same resistance. In some embodiments, the resistors R1, R2, R3, and R4 may have different resistances. For example, the resistance of the resistor R1 can exceed the resistor R2. The resistance of the resistor R1 can fall below the resistor R2. In some embodiments, the resistance of the resistors R1, R2, R3, and R4 can each be 0.1M, 0.2M, 0.3M, 0.5M, 1M, 2M, 3M, 4M, 5M, 6M, 7M, 8MΩ, or more. The resistance of the resistors R1, R2, R3, and R4 can be selected according to design need.

In some embodiments, the transistor T6 is coupled to the disconnect switch PS1. The transistor T6 has a gate configured to receive a control signal P5. In some embodiments, the transistor T7 is coupled to the resistor R1. The transistor T7 has a gate configured to receive the control signal P5. In some embodiments, the transistor T8 is coupled to the resistor R2. The transistor T8 has a gate configured to receive the control signal P5. In some embodiments, the transistor T9 is coupled to the resistor R3. The transistor T9 has a gate configured to receive the control signal P5. In some embodiments, the transistor T10 is coupled to the resistor R4. The transistor T10 has a gate configured to receive the control signal P5.

In some embodiments, in response to the control signal P5, the transistors T6, T7, T8, T9, and T10 are configured to be turned on to generate the signal X at the node W. In some embodiments, a resistance of the configurable reference resistor unit 605 is associated with a status of the disconnect switches PS1, PS2, PS3, and PS4. By blowing one or more of the disconnect switches PS1, PS2, PS3 and PS4, the resistance of the configurable reference resistor unit 605 can be adjusted.

Referring to FIG. 6, the disconnect switch PS1 can be coupled to the conductive contact 622 to receive a status-setting signal VB. The status-setting signal VB in FIG. 6 can be the same with the status-setting signal VB in FIG. 5. In some embodiments, the transistor T1 is coupled to the conductive contact 622. The transistor T1 has a gate configured to receive a control signal P0. In some embodiments, the transistor T2 can be coupled between the disconnect switch PS1 and the ground. The transistor T2 has a gate configured to receive a control signal P1. In some embodiments, the transistor T3 can be coupled between the disconnect switch PS2 and the ground. The transistor T3 has a gate configured to receive a control signal P2. In some embodiments, the transistor T4 can be coupled between the disconnect switch PS3 and the ground. The transistor T4 has a gate configured to receive a control signal P3. In some embodiments, the transistor T5 can be coupled between the disconnect switch PS4 and the ground. The transistor T5 has a gate configured to receive a control signal P4. In some embodiments, the transistor T1 can be coupled to the disconnect switches PS1, PS2, PS3, and PS4.

In response to the control signals P0 and P1, the transistors T1 and T2 are configured to be turned on, such that the status-setting signal VB may be applied to the disconnect switch PS1. In response to the control signals P0 and P2, the transistors T1 and T3 are configured to be turned on, such that the status-setting signal VB may be applied to the disconnect switch PS2. In response to the control signals P0 and P3, the transistors T1 and T4 are configured to be turned on, such that the status-setting signal VB may be applied to the disconnect switch PS3. In response to the control signals P0 and P4, the transistors T1 and T5 are configured to be turned on, such that the status-setting signal VB may be applied to the disconnect switch PS4.

With the status-setting signal VB applied to the disconnect switches PS1, PS2, PS3, or PS4, status of the disconnect switches PS1, PS2, PS3, or PS4 may be changed. In some embodiments, the disconnect switches PS1, PS2, PS3, or PS4 can be blown under the status-setting signal VB.

According to the need, the resistance of the configurable reference resistor unit 605 can be adjusted by blowing one or more of the disconnect switches PS1, PS2, PS3, and PS4. In some embodiments, the configurable reference resistor unit 605 includes fifteen different configurations. Each configuration provides a different overall resistance. Detailed configuration of the configurable reference resistor unit 605 is provided in Table 2 as follows. Columns PS1, PS2, PS3 and PS4 show the status of corresponding disconnect switch, wherein "0" represents an unblown status, and "1" represents a blown status. The column Total resistance shows the total resistance of the configurable reference resistor unit 605 under each configuration.

TABLE 2

| Configuration | PS1 | PS2 | PS3 | PS4 | Total resistance |
|---|---|---|---|---|---|
| 1 | 0 | 0 | 0 | 0 | 1/(1/R1 + 1/R2 + 1/R3 + 1/R4) |
| 2 | 1 | 0 | 0 | 0 | 1/(1/R2 + 1/R3 + 1/R4) |
| 3 | 0 | 1 | 0 | 0 | 1/(1/R1 + 1/R3 + 1/R4) |
| 4 | 0 | 0 | 1 | 0 | 1/(1/R1 + 1/R2 + 1/R4) |
| 5 | 0 | 0 | 0 | 1 | 1/(1/R1 + 1/R2 + 1/R3) |
| 6 | 1 | 1 | 0 | 0 | 1/(1/R3 + 1/R4) |
| 7 | 1 | 0 | 1 | 0 | 1/(1/R2 + 1/R4) |
| 8 | 1 | 0 | 0 | 1 | 1/(1/R2 + 1/R3) |
| 9 | 0 | 1 | 1 | 0 | 1/(1/R1 + 1/R4) |
| 10 | 0 | 1 | 0 | 1 | 1/(1/R1 + 1/R3) |
| 11 | 0 | 0 | 1 | 1 | 1/(1/R1 + 1/R2) |
| 12 | 1 | 1 | 1 | 0 | R4 |
| 13 | 1 | 1 | 0 | 1 | R3 |
| 14 | 1 | 0 | 1 | 1 | R2 |
| 15 | 0 | 1 | 1 | 1 | R1 |
| 16 | 1 | 1 | 1 | 1 | ∞ |

In some embodiments, the resistor R1 can be 1MΩ; the resistor R2 can be 2MΩ; the resistor R3 can be 4MΩ; and the resistor R4 can be 8MΩ. Since Configuration 16 has a total resistance of an infinite value, it is generally not applicable in normal conditions. Accordingly, the total resistance may be variable in a range of 0.533 to 8MΩ. Furthermore, the total resistance of each configuration in this example is provided in Table 2A as follows.

TABLE 2A

| Configuration | PS1 | PS2 | PS3 | PS4 | Total resistance (MΩ) |
|---|---|---|---|---|---|
| 1 | 0 | 0 | 0 | 0 | 0.533 |
| 2 | 1 | 0 | 0 | 0 | 1.143 |
| 3 | 0 | 1 | 0 | 0 | 0.727 |
| 4 | 0 | 0 | 1 | 0 | 0.615 |
| 5 | 0 | 0 | 0 | 1 | 0.571 |
| 6 | 1 | 1 | 0 | 0 | 2.667 |
| 7 | 1 | 0 | 1 | 0 | 1.6 |
| 8 | 1 | 0 | 0 | 1 | 1.333 |
| 9 | 0 | 1 | 1 | 0 | 0.889 |
| 10 | 0 | 1 | 0 | 1 | 0.8 |
| 11 | 0 | 0 | 1 | 1 | 0.667 |
| 12 | 1 | 1 | 1 | 0 | 8 |
| 13 | 1 | 1 | 0 | 1 | 4 |
| 14 | 1 | 0 | 1 | 1 | 2 |
| 15 | 0 | 1 | 1 | 1 | 1 |
| 16 | 1 | 1 | 1 | 1 | ∞ |

As shown in FIG. 6, disconnect switches PS1, PS2, PS3, and PS4 are unblown. FIG. 6 illustrates Configuration 1 listed in Table 2 and Table 2A. That is, the total resistance of the configurable reference resistor 605 can be regarded as the parallel equivalent resistance of the resistors R1, R2, R3, and R4. According to the embodiment of Table 2A, the total resistance of the configurable reference resistor 605 can be about 0.533MΩ.

Figure 6A:
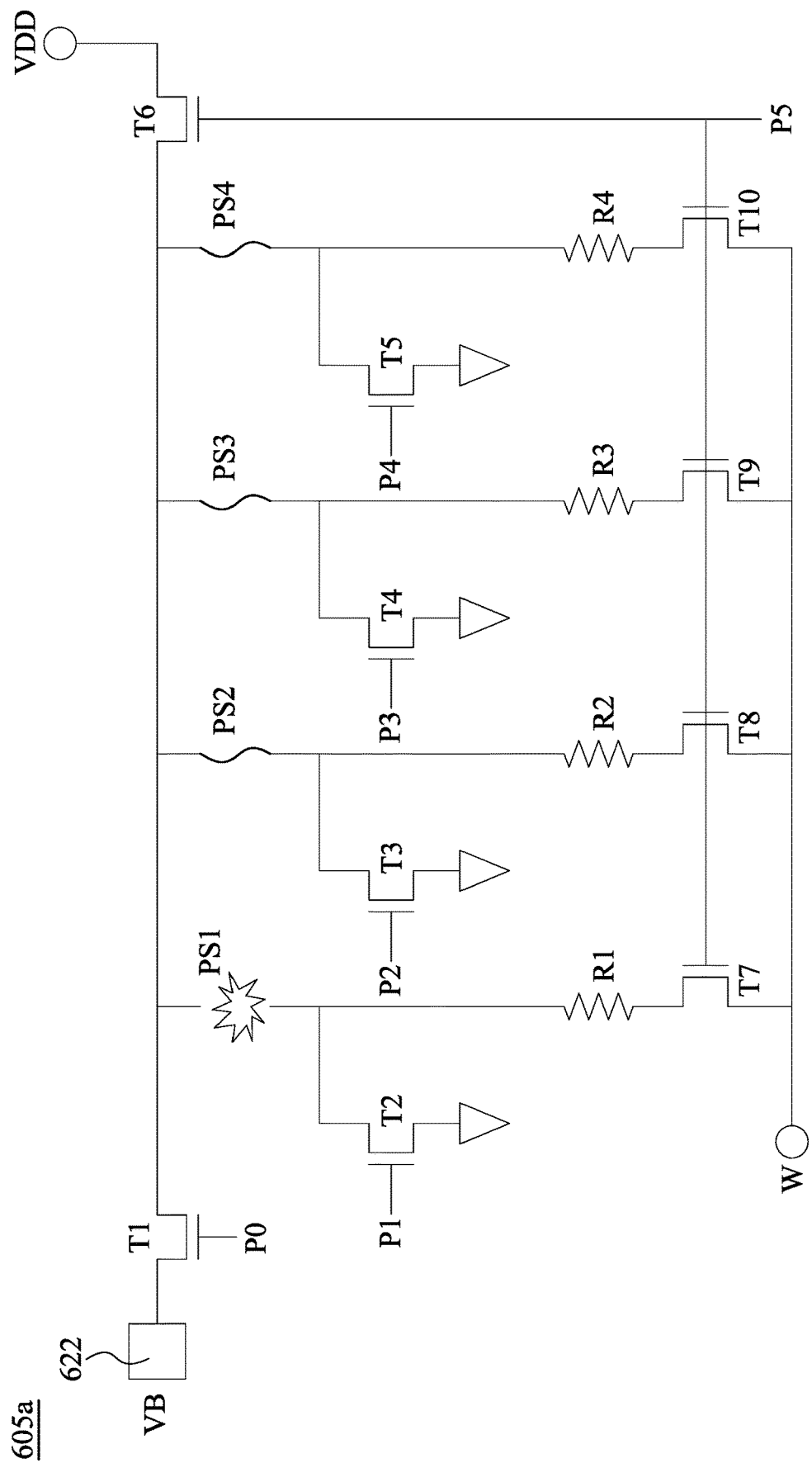
FIG. 6A illustrates configuration of the configurable reference resistor unit, in accordance with some embodiments of the present disclosure.

FIG. 6A illustrates configuration of the configurable reference resistor unit 605a, in accordance with some embodiments of the present disclosure. The configurable reference resistor unit 605a in FIG. 6A is similar to the configurable reference resistor unit 605 in FIG. 6, differing in that in FIG. 6A, the configurable reference resistor unit 605a includes the disconnect switch PS1 being blown.

As shown in FIG. 6A, the disconnect switch PS1 is blown. FIG. 6A illustrates Configuration 1 listed in Table 2 and Table 2A. That is, in this embodiment, the total resistance of the configurable reference resistor 605a can be regarded as the parallel equivalent resistance of the resistors R2, R3, and R4. According to the embodiment of Table 2A, the total resistance of the configurable reference resistor 605a can be 1.143MΩ.

Figure 7:
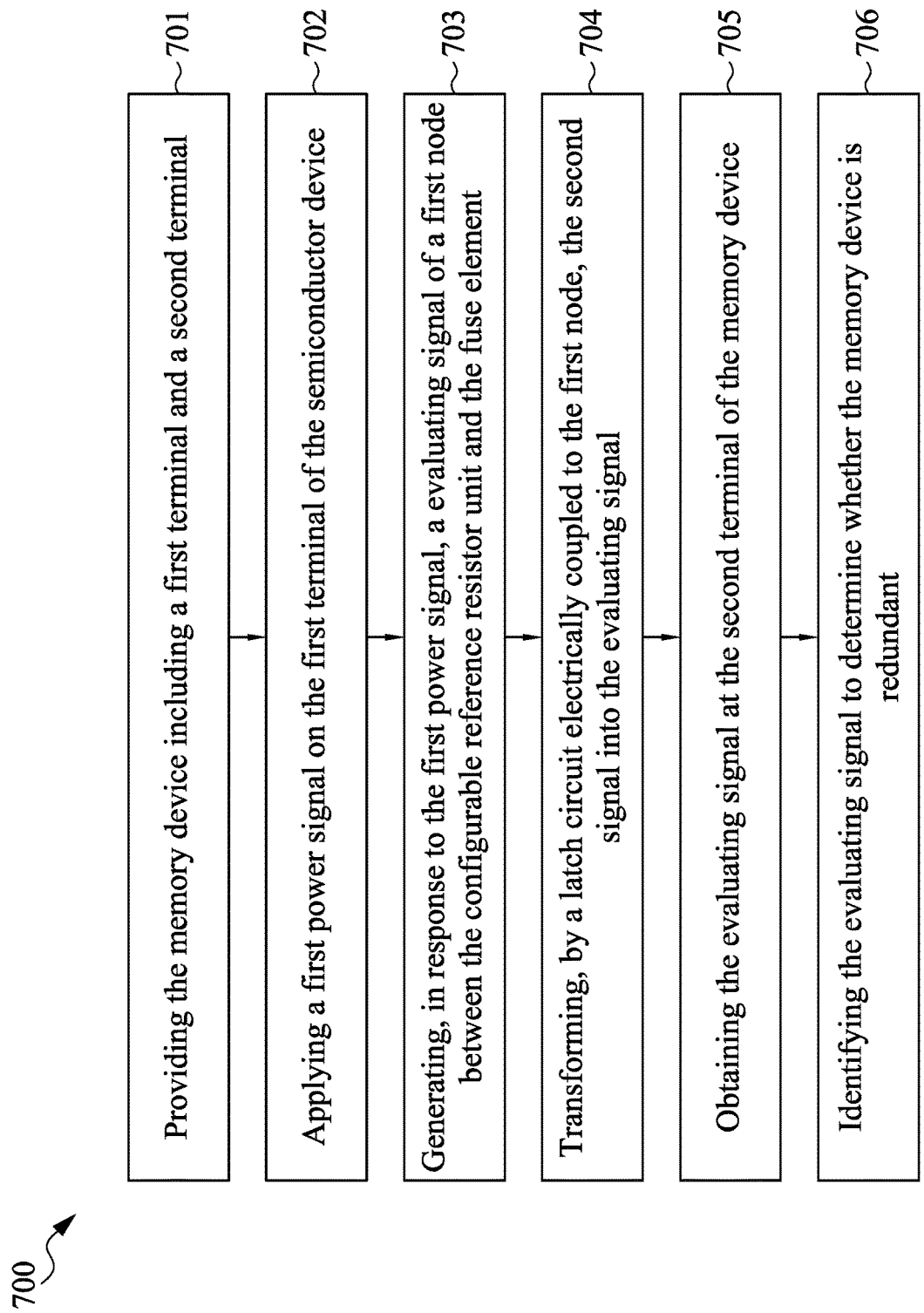
FIG. 7 is a flowchart of a method for determining a status of a fuse element, in accordance with some embodiments of the present disclosure.

FIG. 7 is a flowchart of a method 700 for determining a status of a fuse element, in accordance with some embodiments of the present disclosure. The method 700 can be utilized, for example, to determine a status of the fuse element 101 of FIG. 2. The method 700 for determining a status of a fuse element 101 in a memory device may include operations 701, 702, 703, 704, 705, and 706. In some embodiments, the method 700 may be operated by a system as shown in FIG. 1.

For better understanding, the method 700 may be described referring the semiconductor device (memory device) 100 shown in FIG. 2. In operation 701, a memory device including an input terminal and an output terminal may be provided. In some embodiments, the memory device can include one or more memory cells or memory bits.

In operation 702, a power signal VDD can be applied to the input terminal of the memory device. In some embodiments, the memory device may include a configurable reference resistor unit 105 and a fuse element 101. The configurable reference resistor unit 105 can be electrically coupled to the fuse element 101.

In operation 703, in response to the power signal, a signal X can be generated at a node W between the configurable reference resistor unit 105 and the fuse element 101. In some embodiments, the resistance of the configurable reference resistor unit 105 may exceed the resistance of the fuse element 101. In another embodiments, the configurable reference resistor unit 105 may have a lower resistance than fuse element 101.

In operation 704, the signal X can be transformed by a latch circuit 130 into a signal Y. In some embodiments, the latch circuit 130 can be electrically coupled to the node W. In some embodiments, the process of transforming signal may include inverting or phase shifting signal. In other words, the signal X can be inverted into the signal Y. The signal X can be phase shifted to become the signal Y. In some embodiments, the signal X may be compared with a predetermined signal. Accordingly, in response to the result of comparison, the signal Y can be generated. In some embodiments, the operation of the comparison can be conducted by the latch circuit. In some embodiments, the operation of the comparison can be conducted by an external system coupled to the memory device.

In some embodiments, based on the comparison of the signal X and the predetermined signal, the logic signal Y can be output at the output terminal of the memory device. When the signal X exceeds the predetermined signal, it indicates that the fuse element is not blown. On the contrary, when the signal X fails to exceed the predetermined signal, it indicates that the fuse element 101 is blown.

In some embodiments, with the signal X exceeding the predetermined signal, the latch circuit 130 can output a logic high signal Y. In contrast, when the signal X lower than the predetermined signal, the latch circuit 130 may output a logic low signal Y.

In operation 705, the evaluation signal Y can be obtained at the output terminal of the memory device.

In operation 706, the signal Y is identified to determine whether the memory device is redundant. In some embodiments, the status of the fuse element 101 can be utilized to determine whether the semiconductor device is a redundant device or a normal device. In some embodiments, the operation of identifying the signal Y may be conducted by an external system of the memory device. In some embodiments, as the logic high signal Y is identified, it indicates that the fuse element 101 is blown, and logic low signal Y indicates that the fuse element 101 is unblown.

With the signal identified, the status of the fuse element can be determined. Accordingly, the memory status (normal or redundant) can be determined. With improved status identification, memory issues can be easily solved.

One aspect of the present disclosure provides a semiconductor circuit for determining a status of a fuse element of a memory device. The semiconductor circuit includes a configurable reference resistor unit having a first terminal configured to receive a first power signal and a second terminal configured to electrically couple with the fuse element. The semiconductor circuit also includes a first switching circuit configured to electrically connect the configurable reference resistor unit and the fuse element. In addition, the semiconductor circuit further includes a latch circuit configured to read an evaluation signal of a first node between the configurable reference resistor unit and the fuse element.

Another aspect of the present disclosure provides a semiconductor device for determining a status of a fuse element of a memory device. The semiconductor device comprises a configurable reference resistor unit having a first terminal configured to receive a first power signal and a second terminal configured to electrically couple with the fuse element. The semiconductor device also includes a latch circuit configured to read an evaluation signal of a first node between the configurable reference resistor unit and the fuse element.

Another aspect of the present disclosure provides a method for determining a status of a fuse element of a memory device. The method includes providing the memory device including a first terminal and a second terminal; applying a first power signal on the first terminal of the semiconductor device. The memory device includes a configurable reference resistor unit electrically coupled to the fuse element. The method also includes obtaining an evaluation signal at the second terminal of the memory device; and identifying the evaluation signal to determine whether the memory device is redundant.

The configurable reference resistor unit has variable resistance. The variable resistance can satisfy different resistances in the fuse element, which is caused by process variants. According to the actual resistance of the corresponding fuse element, the resistance of the configurable reference resistor can be changed after the device is completed. Therefore, the present disclosure provides a device having a high flexibility. With the device having the flexible resistor, the additional photomask for reference resistor is not needed. Further, without the additional photomask, the production time can be reduced.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for determining a status of a fuse element of a memory device, comprising:
    electrically coupling a configurable reference resistor unit to the fuse element, wherein the configurable reference resistor unit comprises a first terminal and a second terminal electrically coupled to the fuse element;
    applying a first power signal VDD on the first terminal of the configurable reference resistor unit;
    obtaining an evaluation signal, in response to the first power signal, at a first node between the configurable reference resistor unit and the fuse element, wherein the evaluation signal is formed by:
    electrically connecting a latch circuit to the configurable reference resistor unit, wherein the latch circuit and the fuse element is electrically connected in series;
    generating a first signal, in response to the first power signal, at the first node between the configurable reference resistor unit and the fuse element and transmitting the first signal to the latch circuit; and
    transforming the first signal into a second signal and transforming the second signal into the evaluation signal by the latch circuit;
    identifying the evaluation signal to determine whether the memory device is redundant;
    electrically coupling a first switching circuit between the fuse element and the configurable reference resistor unit to form a conductive path between the fuse element and the configurable reference resistor unit via the first switching circuit;
    electrically coupling a second switching circuit between the latch circuit and the fuse element and the configurable reference resistor unit, wherein the second switching circuit is configured to be turned on to transmit the first signal to the latch circuit;
    electrically coupling the first switching circuit with the second switching circuit in series, wherein the second terminal of the configurable reference resistor unit is electrically connected between the first switching circuit with the second switching circuit;
    wherein the configurable reference resistor unit further comprises:
    a first resistor receiving the first power signal;
    a second resistor connected in series with the first resistor; and
    a first disconnect switch connected in parallel with the first resistor, wherein a resistance value of the configurable reference resistor unit is adjustable according to a status of the first disconnect switch with respect to a resistance of the first resistor and a resistance of the second resistor.

2. The method of claim 1, wherein the transforming the second signal into the evaluation signal further comprises:
    comparing the second signal and a predetermined signal; and
    outputting the evaluation signal based on the comparison between the evaluation signal and the predetermined signal.

3. The method of claim 1, wherein the resistance value of the configurable reference resistor unit before the first disconnect switch is blown is less than the resistance value of the configurable reference resistor unit after the first disconnect switch is blown.

4. The method of claim 3, wherein the first disconnect switch is a metal e-fuse or a poly e-fuse.

5. The method of claim 3, wherein the resistance value of the configurable reference resistor unit is adjusted to the resistance of the second resistor before the first disconnect switch is blown, wherein the resistance value of the configurable reference resistor unit is adjusted to a sum of the resistance of the first resistor and the resistance of the second resistor after the first disconnect switch is blown.

6. The method of claim 3, wherein the configurable reference resistor unit further comprises:
    a first transistor coupled between the first resistor and the first disconnect switch, and having a gate configured to receive a first control signal;
    a second transistor coupled between the first disconnect switch and the first resistor, and having a gate configured to receive the first control signal; and
    a third transistor coupled between the first resistor and the second resistor, and having a gate configured to receive the first control signal.

7. The method of claim 6, wherein in response to the first control signal, the first transistor, the second transistor and the third transistor are configured to be turned on to generate the evaluation signal at the first node between the configurable reference resistor unit and the fuse element.

8. The method of claim 6, wherein the configurable reference resistor unit further comprises:
    a fourth transistor coupled between a first conductive contact and the first disconnect switch, and having a gate configured to receive a second control signal, wherein the fourth transistor is configured to receive a second power signal from the first conductive contact; and
    a fifth transistor coupled between the first disconnect switch and the ground, and having a gate configured to receive the second control signal,
    wherein, in response to the fourth transistor and the fifth transistor being turned on by the second control signal, the status of the first disconnect switch is changed.

9. The method of claim 8, wherein the second power signal has a voltage in a range of 5-6V.

10. The method of claim 1, wherein the latch circuit comprises a first inverter and a second inverter electrically connected to the first inverter in parallel, wherein the second terminal of the configurable reference resistor unit is connected to an input terminal of the first inverter and an output terminal of the inverter while an output terminal of the first inverter is connected to an input terminal of the second inverter.

11. The method of claim 1, further comprising a conductive contact electrically connected to the fuse element for receiving a status-setting signal.

12. The method of claim 1, wherein the latch circuit and the fuse element are electrically connected via the first switching circuit and the second switching circuit.

* * * * *